United States Patent
Silverstein et al.

(10) Patent No.: US 8,033,666 B2
(45) Date of Patent: Oct. 11, 2011

(54) BEAM ALIGNMENT SYSTEM USING ARRAYED LIGHT SOURCES

(75) Inventors: Barry D. Silverstein, Rochester, NY (US); James R. Kircher, Mendon, NY (US); Mark A. Harland, Hilton, NY (US)

(73) Assignee: Eastman Kodak Company, Rochester, NY (US)

( * ) Notice: Subject to any disclaimer, the term of this patent is extended or adjusted under 35 U.S.C. 154(b) by 327 days.

(21) Appl. No.: 12/473,451

(22) Filed: May 28, 2009

(65) Prior Publication Data
US 2010/0302514 A1 Dec. 2, 2010

(51) Int. Cl.
*G03B 21/28* (2006.01)
*F21V 7/00* (2006.01)

(52) U.S. Cl. .......................... 353/37; 362/239; 359/622

(58) Field of Classification Search .................... 353/37, 353/122; 362/239; 359/618, 619, 620, 621, 359/622, 625, 627, 629, 726
See application file for complete search history.

(56) References Cited

U.S. PATENT DOCUMENTS

| | | | |
|---|---|---|---|
| 4,441,791 A | 4/1984 | Hornbeck | |
| 4,978,197 A | 12/1990 | Horikawa | |
| 4,986,634 A | 1/1991 | Horikawa et al. | |
| 5,083,023 A | 1/1992 | Miyagawa | |
| 5,100,237 A * | 3/1992 | Wittekoek et al. | 356/401 |
| 5,313,479 A * | 5/1994 | Florence | 372/26 |
| 5,535,047 A | 7/1996 | Hornbeck | |
| 5,600,383 A | 2/1997 | Hornbeck | |
| 5,704,700 A | 1/1998 | Kappel et al. | |
| 5,719,695 A | 2/1998 | Heimbuch | |
| 5,798,819 A | 8/1998 | Hattori et al. | |
| 5,808,795 A | 9/1998 | Shimomura et al. | |
| 5,887,096 A | 3/1999 | Du et al. | |
| 5,907,437 A | 5/1999 | Sprotbery et al. | |
| 5,914,818 A | 6/1999 | Tejada et al. | |
| 5,918,961 A | 7/1999 | Ueda | |
| 5,930,050 A | 7/1999 | Dewald | |
| 5,933,278 A | 8/1999 | Plummer et al. | |
| 6,008,951 A | 12/1999 | Anderson | |
| 6,010,121 A | 1/2000 | Lee | |
| 6,062,694 A | 5/2000 | Oikawa et al. | |
| 6,075,912 A | 6/2000 | Goodman | |
| 6,089,717 A | 7/2000 | Iwai | |
| 6,124,973 A | 9/2000 | Du et al. | |
| 6,240,116 B1 * | 5/2001 | Lang et al. | 372/50.12 |
| 6,324,320 B1 * | 11/2001 | Goodman | 385/33 |
| 6,552,853 B2 | 4/2003 | Goodman | |
| 6,577,429 B1 * | 6/2003 | Kurtz et al. | 359/279 |
| 6,594,090 B2 * | 7/2003 | Kruschwitz et al. | 359/707 |

(Continued)

FOREIGN PATENT DOCUMENTS
EP 2 003 484 A1 12/2008
(Continued)

*Primary Examiner* — Tony Ko
(74) *Attorney, Agent, or Firm* — Kevin E. Spaulding

(57) ABSTRACT

A beam alignment system for generating an aligned two-dimensional array of parallel light beams, comprising a beam alignment chamber including a base extending in a length direction and a plurality of reflectors mounted on the base, each having independent yaw and pitch adjustments. The beam alignment system further includes a plurality of arrays of light sources, each generating an array of light beams and being paired with a corresponding reflector, the reflectors being disposed to direct the light beams along the length of the beam alignment chamber forming an aligned two-dimensional array of parallel light beams.

14 Claims, 19 Drawing Sheets

U.S. PATENT DOCUMENTS

| | | | |
|---|---|---|---|
| 6,834,963 B2 * | 12/2004 | Kim et al. | 353/31 |
| 6,950,454 B2 | 9/2005 | Kruschwitz et al. | |
| 7,052,145 B2 | 5/2006 | Glenn | |
| 7,190,519 B1 * | 3/2007 | Kitagishi | 359/485.04 |
| 7,420,996 B2 | 9/2008 | Schulte et al. | |
| 7,437,034 B2 | 10/2008 | Gerets et al. | |
| 7,738,178 B2 * | 6/2010 | Bartoschewski et al. | 359/641 |
| 7,826,141 B2 * | 11/2010 | Powell et al. | 359/629 |
| 2005/0057731 A1 | 3/2005 | Lee et al. | |
| 2005/0099698 A1 | 5/2005 | Teijido | |
| 2006/0001973 A1 | 1/2006 | Peterson et al. | |
| 2006/0023173 A1 | 2/2006 | Mooradian et al. | |
| 2009/0040477 A1 | 2/2009 | Matsumoto | |

FOREIGN PATENT DOCUMENTS

| | | |
|---|---|---|
| EP | 2 043 211 A2 | 4/2009 |
| WO | WO 01/06297 A2 | 1/2001 |
| WO | WO 2005/063433 A1 | 7/2005 |

* cited by examiner

BEAM ALIGNMENT SYSTEM USING ARRAYED LIGHT SOURCES

CROSS REFERENCE TO RELATED APPLICATIONS

The present invention is related to commonly assigned U.S. patent application Ser. No. 11/937,729 filed Nov. 9, 2007 entitled "Projection Apparatus Using Solid-State Light Source Array" by Barry D. Silverstein, et al., commonly assigned U.S. patent application Ser. No. 12/121,185 filed May 15, 2008 entitled "Uniform Speckle Reduced Laser Projection Using Spatial and Temporal Mixing" by Barry D. Silverstein, et al., commonly assigned U.S. patent application Ser. No. 12/432,856 filed Apr. 30, 2009 entitled "Digital Projector Using Arrayed Light Sources" by Mark A. Harland, et al., and commonly assigned U.S. patent application Ser. No. 12/432,999 filed Apr. 30, 2009 entitled "Beam Alignment Chamber Providing Divergence Correction" by Barry D. Silverstein, et al.

FIELD OF THE INVENTION

This invention generally relates to an apparatus for projecting a digital image and more particularly relates to an improved apparatus and method for aligning solid state lasers as illumination sources.

BACKGROUND OF THE INVENTION

In order to be considered suitable to replace conventional film projectors, digital projection systems, particularly multicolor cinematic projection systems, must meet demanding requirements for image quality and performance. Among other features, this means high resolution, wide color gamut, high brightness, and frame-sequential contrast ratios exceeding 1,000:1.

The most promising solutions for multicolor digital cinema projection employ, as image forming devices, one of two basic types of spatial light modulators (SLMs). The first type of spatial light modulator is the Digital Light Processor (DLP) a digital micromirror device (DMD), developed by Texas Instruments, Inc., Dallas, Tex. DLP devices are described in a number of patents, for example U.S. Pat. Nos. 4,441,791; 5,535,047; 5,600,383 (all to Hombeck); and U.S. Pat. No. 5,719,695 (Heimbuch). Optical designs for projection apparatus employing DLPs are disclosed in U.S. Pat. No. 5,914,818 (Tejada et al.); U.S. Pat. No. 5,930,050 (Dewald); U.S. Pat. No. 6,008,951 (Anderson); and U.S. Pat. No. 6,089,717 (Iwai). DLPs have been successfully employed in digital projection systems.

FIG. 1 shows a simplified block diagram of a projector apparatus 10 that uses DLP spatial light modulators. A light source 12 provides polychromatic light into a prism assembly 14, such as a Philips prism, for example. Prism assembly 14 splits the polychromatic light into red, green, and blue component bands and directs each band to the corresponding spatial light modulator 20r, 20g, or 20b. Prism assembly 14 then recombines the modulated light from each SLM 20r, 20g, and 20b and provides this light to a projection lens 30 for projection onto a display screen or other suitable surface.

Although DLP-based projectors demonstrate the capability to provide the necessary light throughput, contrast ratio, and color gamut for most projection applications from desktop to large cinema, there are inherent resolution limitations, with current devices providing only 2148×1080 pixels. In addition, high component and system costs have limited the suitability of DLP designs for higher-quality digital cinema projection. Moreover, the cost, size, weight, and complexity of the Philips or other suitable prisms as-well as the fast projection lens with a long working distance required for brightness are inherent constraints with negative impact on acceptability and usability of these devices.

A second type of spatial light modulator used for digital projection is the LCD (Liquid Crystal Device). The LCD forms an image as an array of pixels by selectively modulating the polarization state of incident light for each corresponding pixel. LCDs appear to have advantages as spatial light modulators for high-quality digital cinema projection systems. These advantages include relatively large device size, favorable device yields and the ability to fabricate higher resolution devices, for example 4096×2160 resolution devices by Sony and JVC Corporations. Among examples of electronic projection apparatus that utilize LCD spatial light modulators are those disclosed in U.S. Pat. No. 5,808,795 (Shimomura et al.); U.S. Pat. No. 5,798,819 (Hattori et al.); U.S. Pat. No. 5,918,961 (Ueda); U.S. Pat. No. 6,010,121 (Lee.); and U.S. Pat. No. 6,062,694 (Oikawa et al.). LCOS (Liquid Crystal On Silicon) devices are thought to be particularly promising for large-scale image projection. However, LCD components have difficulty maintaining the high quality demands of digital cinema, particularly with regard to color and contrast, as the high thermal load of high brightness projection affects the materials polarization qualities.

A continuing problem with illumination efficiency relates to etendue or, similarly, the Lagrange invariant. As is well known in the optical arts, etendue relates to the amount of light that can be handled by an optical system. Potentially, the larger the etendue, the brighter the image. Numerically, etendue is proportional to the product of two characteristics, namely the image area and the numerical aperture. In terms of the simplified optical system represented in FIG. 2 having light source 12, optics 18, and a spatial light modulator 20, etendue is a factor of the area of the light source A1 and its output angle θ1 and is equal to the area of the modulator A2 and its acceptance angle θ2. For increased brightness, it is desirable to provide as much light as possible from the area of light source 12. As a general principle, the optical design is advantaged when the etendue at the light source is most closely matched by the etendue at the modulator.

Increasing the numerical aperture, for example, increases etendue so that the optical system captures more light. Similarly, increasing the source image size, so that light originates over a larger area, increases etendue. In order to utilize an increased etendue on the illumination side, the etendue must be greater than or equal to that of the illumination source. Typically, however, the larger the image, the more costly and sizeable the optics and support components. This is especially true of devices such as LCOS and DLP components, where the silicon substrate and defect potential increase with size. As a general rule, increased etendue results in a more complex and costly optical design. Using an approach such as that outlined in U.S. Pat. No. 5,907,437 (Sprotbery et al.) for example, lens components in the optical system must be designed for large etendue. The source image area for the light that must be converged through system optics is the sum of the combined areas of the spatial light modulators in red, green, and blue light paths; notably, this is three times the area of the final multicolor image formed. That is, for the configuration disclosed in U.S. Pat. No. 5,907,437, optical components handle a sizable image area, therefore a high etendue, since red, green, and blue color paths are separate and must be optically converged. Moreover, although a configuration such as that disclosed in U.S. Pat. No. 5,907,437 handles light from three times the area of the final multicolor image formed, this configuration does not afford any benefit of increased brightness, since each color path contains only one-third of the total light level.

Efficiency improves when the etendue of the light source is well-matched to the etendue of the spatial light modulator. Poorly matched etendue means that the optical system is either light-starved, unable to provide sufficient light to the spatial light modulators, or inefficient, effectively discarding a substantial portion of the light that is generated for modulation.

The goal of providing sufficient brightness for digital cinema applications at an acceptable system cost has thus far proved elusive to designers of both LCD and DLP systems. LCD-based systems have been compromised by the requirement for polarized light, reducing efficiency and increasing etendue, even where polarization recovery techniques are used. DLP device designs, not requiring polarized light, have proven to be somewhat more efficient, but still require expensive, short lived lamps and costly optical engines, making them too expensive to compete against conventional cinema projection equipment.

In order to compete with conventional high-end film-based projection systems and provide what has been termed electronic or digital cinema, digital projectors must be capable of achieving comparable cinema brightness levels to this earlier equipment. As some idea of scale, the typical theatre requires on the order of 10,000 lumens projected onto screen sizes on the order of 40 feet in diagonal. The range of screens requires anywhere from 5,000 lumens to upwards of 40,000 lumens. In addition to this demanding brightness requirement, these projectors must also deliver high resolution (2048×1080 pixels) and provide around 2000:1 contrast and a wide color gamut.

Some digital cinema projector designs have proved to be capable of this level of performance. However, high equipment and operational costs have been obstacles. Projection apparatus that meet these requirements typically cost in excess of $50,000 each and utilize high wattage Xenon arc lamps that need replacement at intervals between 500-2000 hours, with typical replacement cost often exceeding $1000. The large etendue of the Xenon lamp has considerable impact on cost and complexity, since it necessitates relatively fast optics to collect and project light from these sources.

One drawback common to both DLP and LCOS LCD spatial light modulators (SLM) has been their limited ability to use solid-state light sources, particularly laser sources. Although they are advantaged over other types of light sources with regard to relative spectral purity and potentially high brightness levels, solid-state light sources require different approaches in order to use these advantages effectively. Conventional methods and devices for conditioning, redirecting, and combining light from color sources, used with earlier digital projector designs, can constrain how well laser array light sources are used.

Solid-state lasers promise improvements in etendue, longevity, and overall spectral and brightness stability but, until recently, have not been able to deliver visible light at sufficient levels and within the cost needed to fit the requirements for digital cinema. In a more recent development, VCSEL laser arrays have been commercialized and show some promise as potential light sources. However, the combined light from as many as 9 individual arrays is needed in order to provide the necessary brightness for each color.

Examples of projection apparatus using laser arrays include the following:

U.S. Pat. No. 5,704,700 entitled "Laser Illuminated Image Projection System and Method of Using Same" to Kappel et al. describes the use of a microlaser array for projector illumination.

Commonly assigned U.S. Pat. No. 6,950,454 to Kruschwitz et al. entitled "Electronic Imaging System Using Organic Laser Array Illuminating an Area Light Valve" describes the use of organic lasers for providing laser illumination to a spatial light modulator.

U.S. Patent Application Publication No. 2006/0023173 entitled "Projection Display Apparatus, System, and Method" to Mooradian et al. describes the use of arrays of extended cavity surface-emitting semiconductor lasers for illumination;

U.S. Pat. No. 7,052,145 entitled "Displays Using Solid-State Light Sources" to Glenn describes different display embodiments that employ arrays of microlasers for projector illumination.

U.S. Pat. No. 6,240,116 entitled Laser Diode Array Assemblies With Optimized Brightness Conservation" to Lang et al. discusses the packaging of conventional laser bar- and edge-emitting diodes with high cooling efficiency and describes using lenses combined with reflectors to reduce the divergence-size product (etendue) of a 2 dimensional array by eliminating or reducing the spacing between collimated beams.

There are difficulties with each of these types of solutions. Kappel '700 teaches the use of a monolithic array of coherent lasers for use as the light source in image projection, whereby the number of lasers is selected to match the power requirements of the lumen output of the projector. In a high lumen projector, however, this approach presents a number of difficulties. Manufacturing yields drop as the number of devices increases and heat problems can be significant with larger scale arrays. Coherence can also create problems for monolithic designs. Coherence of the laser sources typically causes artifacts such as optical interference and speckle. It is, therefore, preferable to use an array of lasers where coherence, spatial and temporal coherence is weak or broken. While a spectral coherence is desired from the standpoint of improved color gamut, a small amount of broadening of the spectrum is also desirable for removing the sensitivity to interference and speckle and also lessens the effects of color shift of a single spectral source. This shift could occur, for example, in a three color projection system that has separate red, green and blue laser sources. If all lasers in the single color arrays are tied together and of a narrow wavelength and a shift occurs in the operating wavelength, the white point and color of the entire projector may fall out of specification. On the other hand, where the array is averaged with small variations in the wavelengths, the sensitivity to single color shifts in the overall output is greatly reduced. While components may be added to the system to help break this coherence as discussed by Kappel, it is preferred from a cost and simplicity standpoint to utilize slightly varying devices from differing manufactured lots to form a substantially incoherent laser source. Additionally reducing the spatial and temporal coherence at the source is preferred, as most means of reducing this incoherence beyond the source utilizes components such as diffusers, which increase the effective extent of the source (etendue), cause additional light loss, and add expense to the system. Maintaining the small etendue of the lasers enable a simplification of the optical train, which is highly desired.

Laser arrays of particular interest for projection applications are various types of VCSEL (Vertical Cavity Surface- Emitting Laser) arrays, including VECSEL (Vertical Extended Cavity Surface-Emitting Laser) and NECSEL (Novalux Extended Cavity Surface-Emitting Laser) devices from Novalux, Sunnyvale, Calif. However, conventional solutions using these devices are prone to a number of problems. One limitation relates to device yields. Due largely to heat and packaging problems for critical components, the commercialized VECSEL array is extended in length, but limited in height; typically, a VECSEL array has only two rows of emitting components. The use of more than two rows tends to dramatically increase yield difficulties. This practical limitation would make it difficult to provide a VECSEL illumination system for projection apparatus as described in the Glenn '145 disclosure, for example. Brightness would be constrained when using the projection solutions proposed in the Mooradian et al. '3173 disclosure. Although Kruschwitz et al. '454 and others describe the use of laser arrays using organic VCSELs, these organic lasers have not yet been successfully commercialized. In addition to these problems, conventional VECSEL designs are prone to difficulties with power connection and heat sinking. These lasers are of high power; for example, a single row laser device, frequency doubled into a two row device from Novalux produces over 3 W of usable light. Thus, there can be significant current requirements and heat load from the unused current. Lifetime and beam quality is highly dependent upon stable temperature maintenance.

Coupling of the laser sources to the projection system presents other difficulties that are not adequately addressed using conventional approaches. For example, using Novalux NECSEL lasers, approximately nine 2 row by 24 laser arrays are required for each color in order to approximate the 10,000 lumen requirement of most theatres. It is desirable to mount these sources separately in order to provide sufficient heat dissipation as well as for running power and control signals and allowing modular design that simplifies servicing and replacement. At the same time, however, it is necessary to combine the laser beams from multiple sources in order to form a single beam that provides collimated light. Solutions that overlay individual beams lose some of the generated light due to inefficiencies in beam-combining coatings. Any angular component introduced in the combining process increases the etendue and is generally undesirable. Redirecting multiple beams with minimal spacing between beams is desirable, but not easily achieved using conventional beam-combining techniques.

Thus, it can be seen that there is a need for illumination solutions that capitalize on the advantages of solid-state array light sources and allow effective use of solid-state illumination components with DLP and LCOS modulators.

SUMMARY OF THE INVENTION

The present invention addresses the need for improved brightness for projection display by providing a beam alignment system for generating an aligned two-dimensional array of parallel light beams, comprising:
a) a beam alignment chamber including:
 i) a base, the base extending in a length direction having a front edge, a first side edge and a second side edge; and
 ii) a plurality of reflectors mounted on the base, each having independent yaw and pitch adjustments; and
b) a plurality of arrays of light sources, each array of light sources generating an array of light beams and being paired with a corresponding reflector and being disposed to direct the light beams onto its corresponding reflector, and wherein the reflectors are disposed to direct the light beams along the length of the beam alignment chamber forming an aligned two-dimensional array of parallel light beams.

It is a feature of the present invention that it provides an apparatus and method for laser beam alignment that provides a two-dimensional array of parallel output beams from a plurality of arrays of light sources.

It is an advantage of the present invention that it provides an apparatus for compact packaging of multiple laser light arrays, aligning the arrays in parallel along an output light path.

These and other features and advantages of the present invention will become apparent to those skilled in the art upon a reading of the following detailed description when taken in conjunction with the drawings wherein there is shown and described an illustrative embodiment of the invention.

DETAILED DESCRIPTION OF THE INVENTION

The present description is directed in particular to elements forming part of, or cooperating more directly with, apparatus in accordance with the invention. It is to be understood that elements not specifically shown or described may take various forms well known to those skilled in the art.

Figures shown and described herein are provided to illustrate principles of operation according to the present invention and are not drawn with intent to show actual size or scale. Because of the relative dimensions of the component parts for the laser array of the present invention, some exaggeration is necessary in order to emphasize basic structure, shape, and principles of operation.

Figure 1:
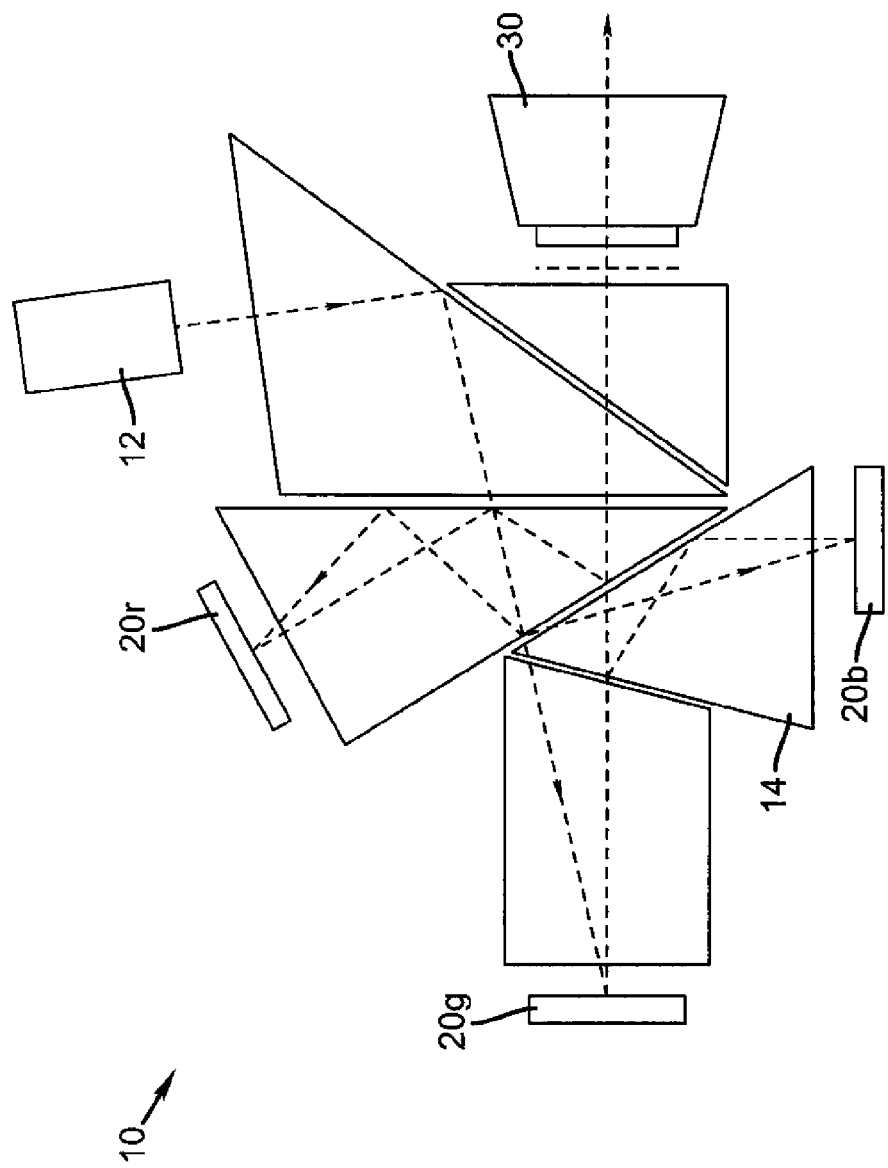
FIG. 1 is a schematic block diagram of a conventional projection apparatus using a combining prism for the different color light paths.
Figure 2:
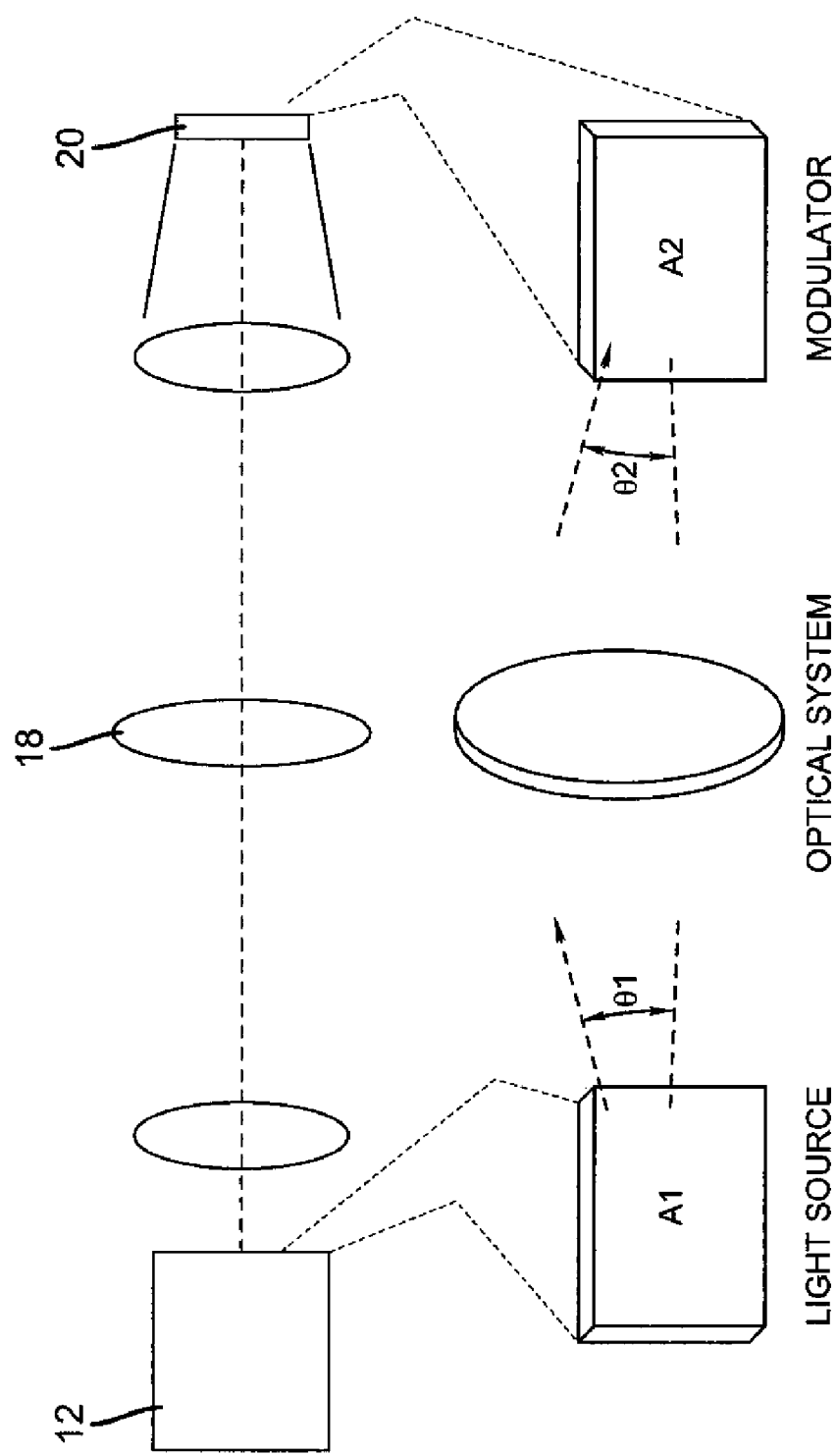
FIG. 2 is a representative diagram showing etendue for an optical system.
Figure 3A:
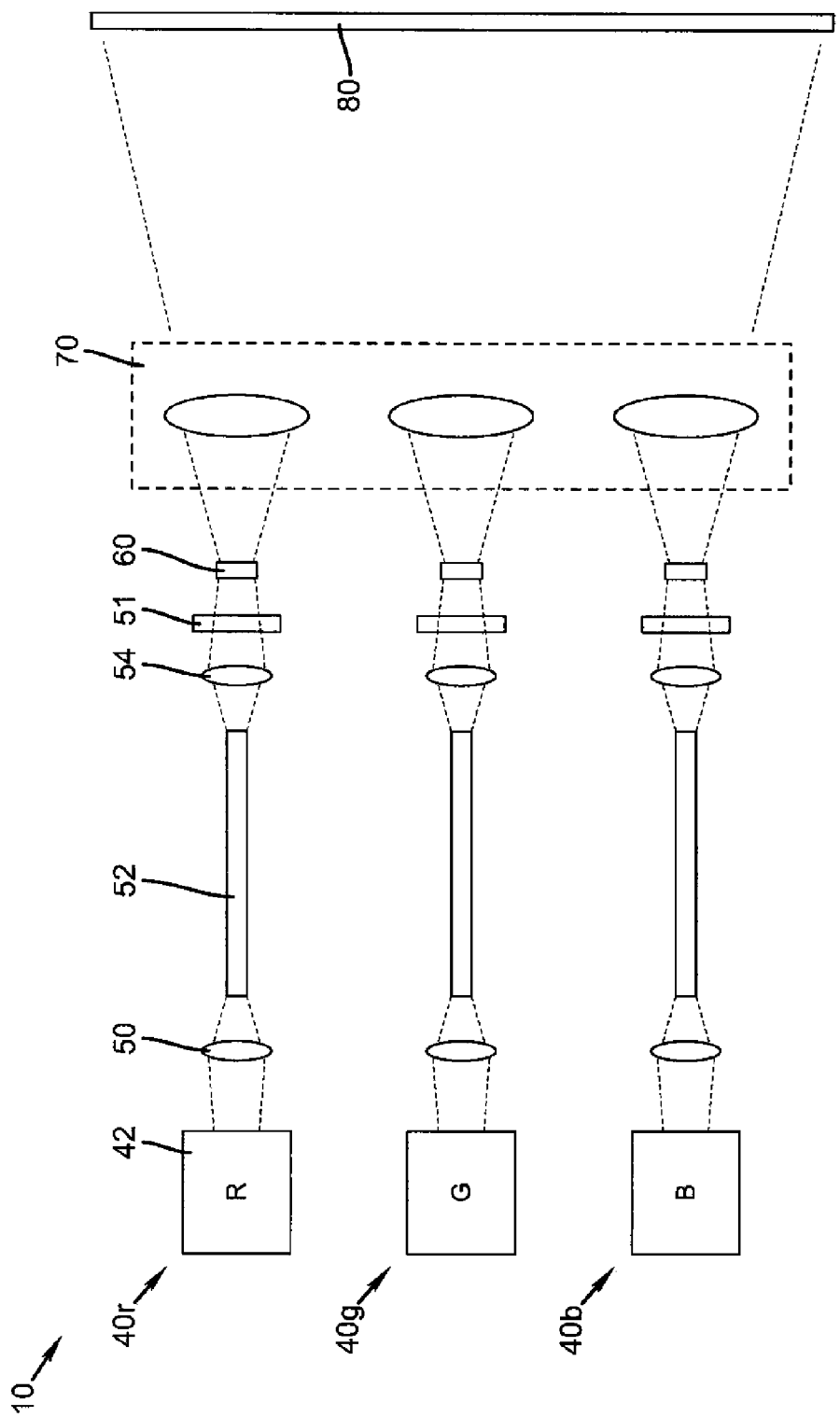
FIG. 3A is a schematic block diagram showing the general arrangement of a projection apparatus having multiple color channels and multiple sets of projection optics for image projection.
Figure 3B:
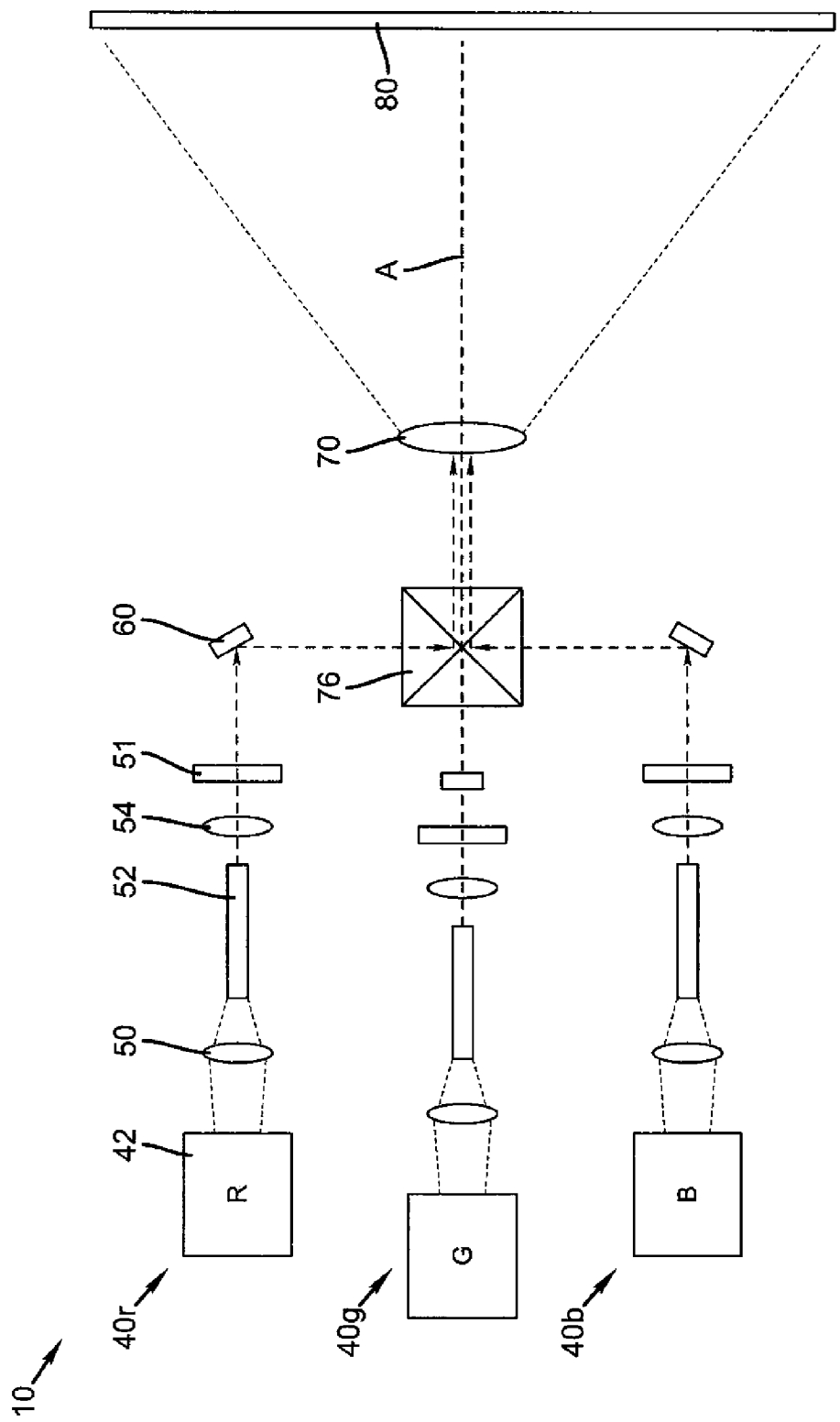
FIG. 3B is a schematic block diagram showing the general arrangement of a projection apparatus having multiple color channels combined to use a single set of projection optics for image projection.

Embodiments of the present invention address the need for improved light intensity for each color channel in an electronic image projector. In order to better understand the present invention, it is instructive to describe the overall context within which apparatus and methods of the present invention can operate. The schematic diagrams of FIGS. 3A and 3B show two basic architectures for the projection apparatus 10 of FIG. 1. Embodiments of the present invention can be suitably employed as part of the illumination system for either of these basic architectures.

Turning first to FIG. 3A, there is shown a basic arrangement for projection apparatus 10 that is used in a number of embodiments of the present invention. Three light modulation channels 40r, 40g, and 40b are shown, each modulating one of the primary red, green, or blue (RGB) colors from an illumination system 42. In each light modulation channel 40r, 40g, and 40b, an optional lens 50 may direct light into an optional polarization maintaining light guide 52. At the output of light guide 52, or otherwise receiving light from lens 50, a lens 54 then directs light through an integrator 51, such as a fly's eye integrator or integrating bar, for example. This light goes to a spatial light modulator 60 that is part of an image forming system for projector apparatus 10. Spatial light modulator 60 is typically a micro-electromechanical systems (MEMS) device, such as a DLP or other type of reflective MEMS component, including any of the types of MEMS modulator components that modulate light by reflection or by diffraction. These devices can be considered as "polarization state neutral", since they do not modulate light at each pixel by modulating the polarization state of the pixel; any change to the polarization state of the incident light for any pixel is inadvertent, a function of its incident angle when reflected from the MEMS surfaces for that pixel. The incident angle of light to the MEMS spatial light modulator can be adjusted to minimize any unwanted polarization effects. Projection optics 70, indicated generally in a dashed outline in FIG. 3A due to its many possible embodiments, then direct the modulated light to a display surface 80.

Turning next to FIG. 3B, a color combiner 76 is used for combining the modulated light from each color light modulation channel 40r, 40g, 40b onto a common output axis A for projection. Color combiner 76 may be an assembly of prisms or dichroic surfaces, such as an X-cube or other combining device, familiar to those skilled in the electronic imaging arts.

Figure 4:
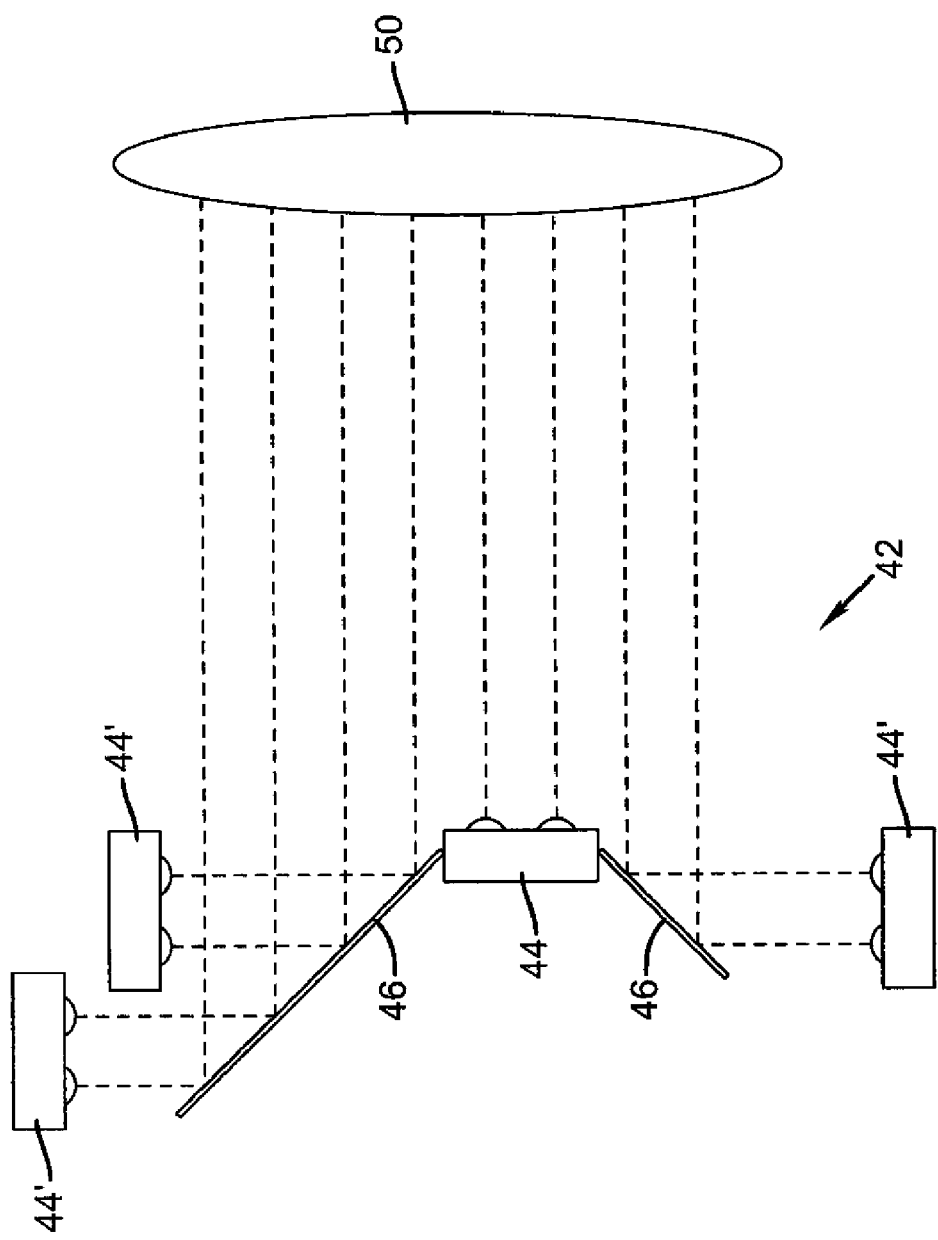
FIG. 4 is a schematic showing beam alignment with solid-state laser arrays using reflective surfaces.

Using either of these two basic imaging architectures, the function of illumination system 42 is the same: combining the light from two or more laser arrays, aligning the individual light beams along a common illumination path. FIG. 4 shows one approach for combining multiple light source arrays 44 and 44' to form a larger array with aligned collimated beams. One or more interspersed mirrors 46 may be used to place the optical axis of additional light source arrays 44' in line with solid-state light source array 44. However, it can be appreciated that heat and spacing requirements may limit how many light source arrays 44 can be stacked in this manner. In addition, the spacing between beam sources is also constrained with this solution.

Figure 5A:
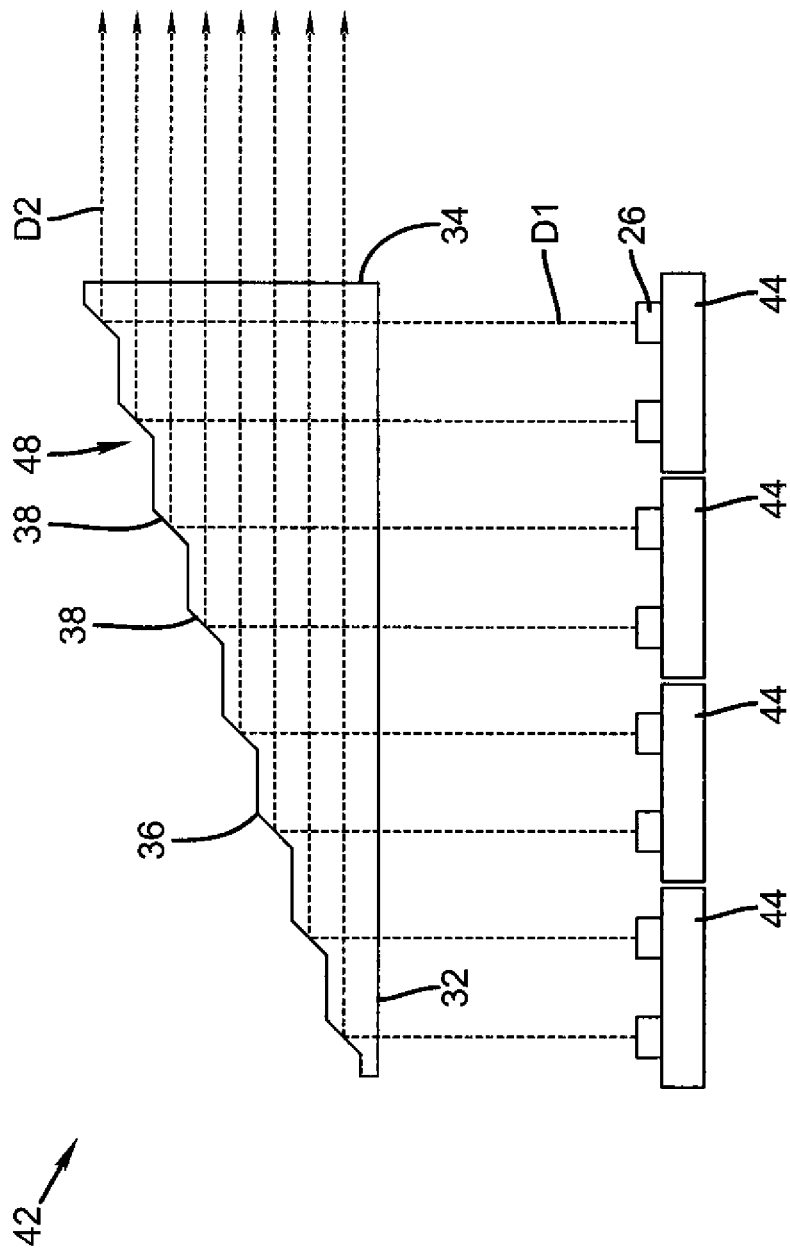
FIG. 5A is a schematic side-view diagram showing the use of a light-redirecting prism for combining illumination from multiple solid-state laser light arrays.
Figure 5B:
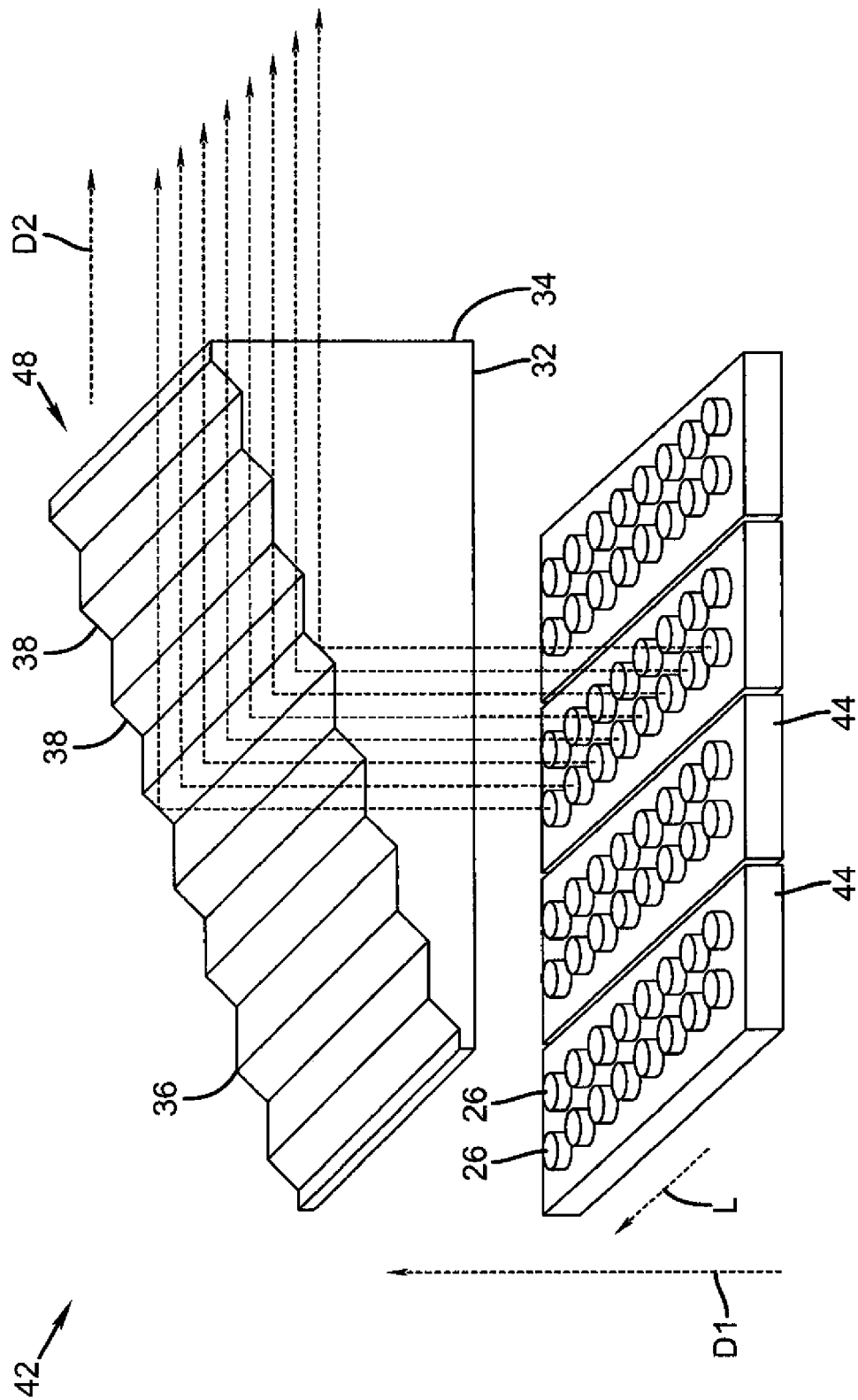
FIG. 5B is a perspective of the light-redirecting prism of FIG. 7A.

The side and perspective views of FIGS. 5A and 5B show an improved approach to beam combination using a light redirecting prism 48. Here, illumination system 42 combines laser light from four solid-state light arrays 44, concentrated within an even smaller area than the array arrangement of FIG. 4. Light-redirecting prism 48 has an incident face 32 that accepts light emitted from light source arrays 44 comprised of lasers 26 in an emission direction D1. Light is redirected through an output face 34 in an output direction D2 that is substantially orthogonal to emission direction D1. Light redirecting prism 48 has a redirection surface 36 that has light-redirecting facets 38. Light-redirecting facets 38 are at an oblique angle relative to emission direction D1 and provide Total Internal Reflection (TIR) to light emitted from lasers 26. When staggered as shown in FIGS. 5A and 5B, these features help to narrow the light path for this illumination, providing a narrower light beam. As FIG. 5B shows, light source arrays 44 each have multiple lasers 26 that extend in a length direction L. Light-redirecting facets 38 and other facets on redirection surface 36 also extend in direction L.

Figure 6:
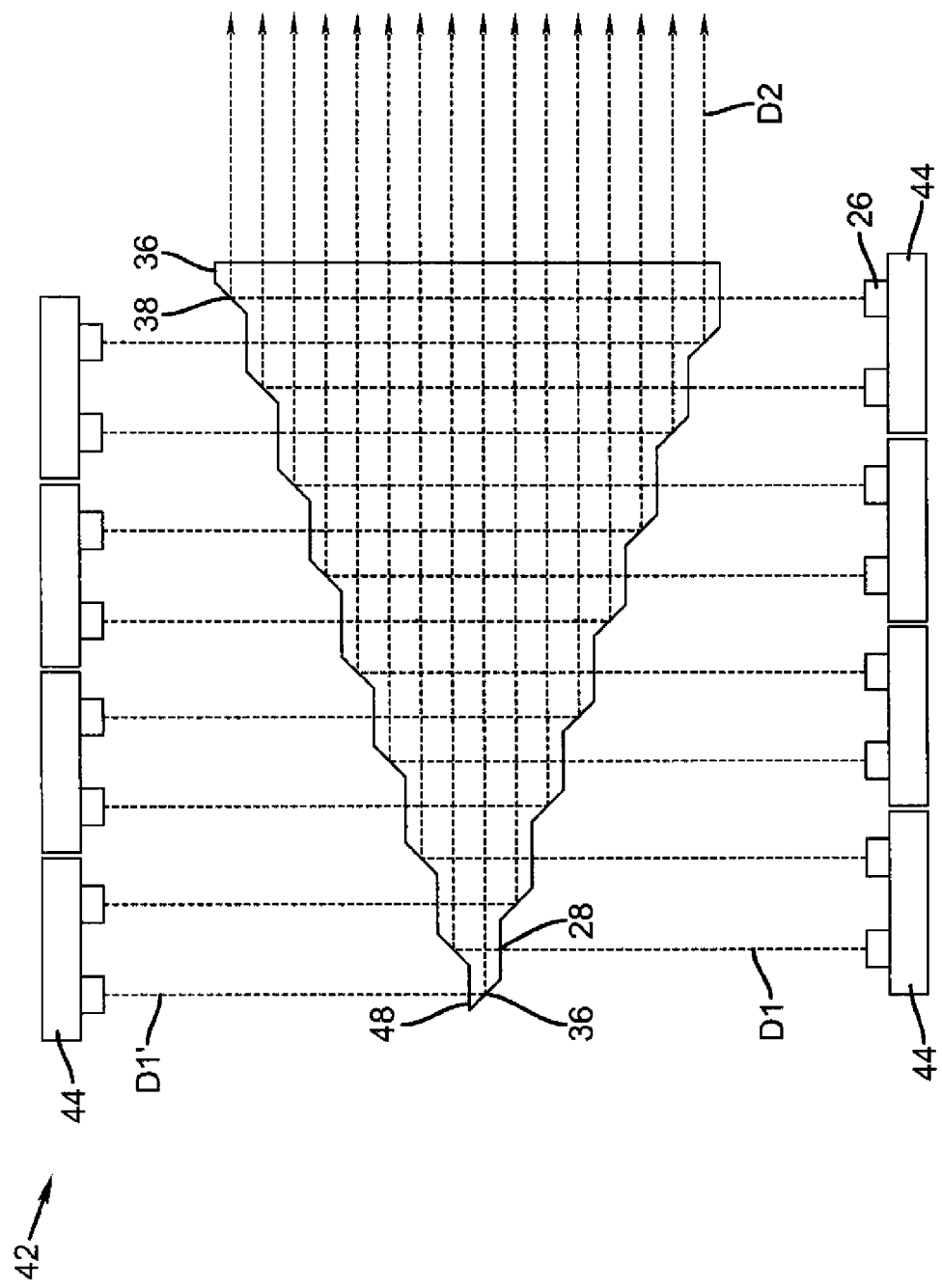
FIG. 6 is a schematic side view of a light-redirecting prism that accepts light from two different sides.

The cross-sectional side view of FIG. 6 shows another embodiment of light-redirecting prism 48 in illumination system 42 that provides an even more compact arrangement of illumination than the embodiment shown in FIGS. 5A and 5B for using light source arrays. In this embodiment, light-redirecting prism 48 has two redirection surfaces 36, accepting light from light source arrays 44 that are facing each other, with opposing emission directions D1 and D1'. Each redirection surface 36 has two types of facets: a light-redirecting facet 38 and an incidence facet 28 that is normal to the incident light from the corresponding light source array 44.

The overall approach using light redirecting prism 48 offers an improvement to conventional methods for forming a light beam of collimated rays, but has some limitations. One problem relates to alignment difficulties. With this light combination geometry, each of the light source arrays 44 must be very precisely aligned in order to properly aim the light beams in the proper direction. This requires that each laser source be precisely registered or custom aligned to the prism, placing considerable demands on laser mounting mechanics. Since high power lasers generate significant heat, the need to remove this heat further complicates mounting and alignment. While this arrangement allows some measure of scalability, this is limited by how closely together light source arrays 44 can be placed. In addition, light-redirecting prism 48 can be difficult to mount and changing temperatures of the prism material under operating conditions can cause unwanted birefringence and other problems. The need to properly shield the laser light adds a further complication.

The present invention addresses the need for an improved light source that combines collimated light from a plurality of lasers of each wavelength by providing a beam alignment chamber for each color channel. With respect to FIGS. 3A and 3B, the beam alignment chamber of the present invention is part of the illumination system 42 within each corresponding light modulation channel 40r, 40g, 40b.

Figure 7:
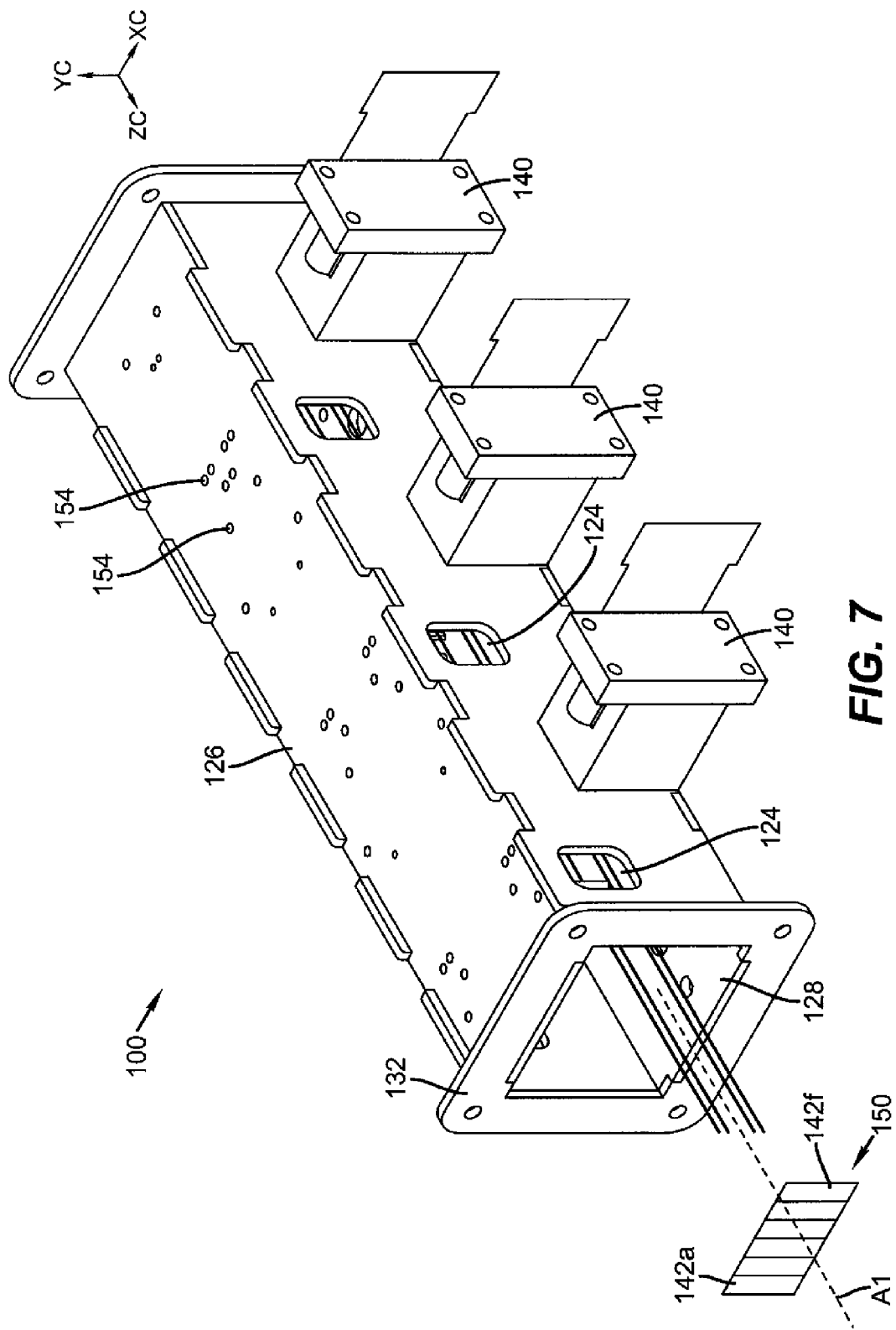
FIG. 7 is a perspective of a beam alignment chamber for combining light from multiple solid-state laser arrays in one embodiment.

The perspective of FIG. 7 shows a beam alignment chamber 100 that combines and interleaves the output beams of several solid-state light source arrays, such as laser array sources, in order to generate a composite light beam formed from a plurality of light beams, shown in this embodiment as collimated, all parallel to an illumination axis Al that extends in the length direction of beam alignment chamber 100.

FIGS. 8, 9, 10, and 11 show various details of beam alignment chamber 100 construction in one embodiment.

Referring to the different views of FIGS. 7-11, beam alignment chamber 100 has a base 110 with front and back edges 112 and 114, and first and second side edges 116 and 118. There are opposed first and second side walls 120 and 122 along first and second side edges 116 and 118, respectively, and extending along the length of beam alignment chamber 100, and a front wall 132. Side openings 124 are provided within side walls 120 and 122 for light beams from array light sources 140 to enter the beam alignment chamber 100. Light exiting the beam alignment chamber 100 passes through an output opening 128 in front wall 132. A plurality of reflectors 130 are disposed at an oblique angle with respect to side walls 120 and 122 to direct light beams from a corresponding array light source 140 to exit the beam alignment chamber 100 through the output opening 128, forming an aligned two-dimensional array of parallel light beams. Reflectors 130 mount to base 110 and, optionally, to a cover 126. Each reflector 130 has its own independent adjustment for pitch and yaw, allowing precision alignment of the light beams from each array light source 140. FIG. 7 shows a plurality of adjustment access holes 154 provided in cover 126 for this purpose. One or more adjustment access holes 154 can alternately be provided along base 110. In the embodiment of FIG. 7, all pitch and yaw adjustments for both top- and base-mounted reflectors can be accessed from cover 126.

The beam alignment chamber 100 embodiment shown in FIGS. 7-11 has a modular configuration and squared cylindrical shape, with side edges 116 and 118 of base 110 intersecting with first and second side walls 120 and 122. This arrangement is advantaged for its compactness and relative ease of mounting. However, other side wall 120 and 122 arrangements are possible. In an alternate embodiment of the present invention, base 110 is some other shape, such as triangular, for example and has only a front edge and first and second side edges. In another embodiment, base 110 is part of a larger chassis structure and extends beyond side walls 120 and 122. The function of cover 126 may alternately be provided by some other part of a chassis or other structure.

Figure 8:
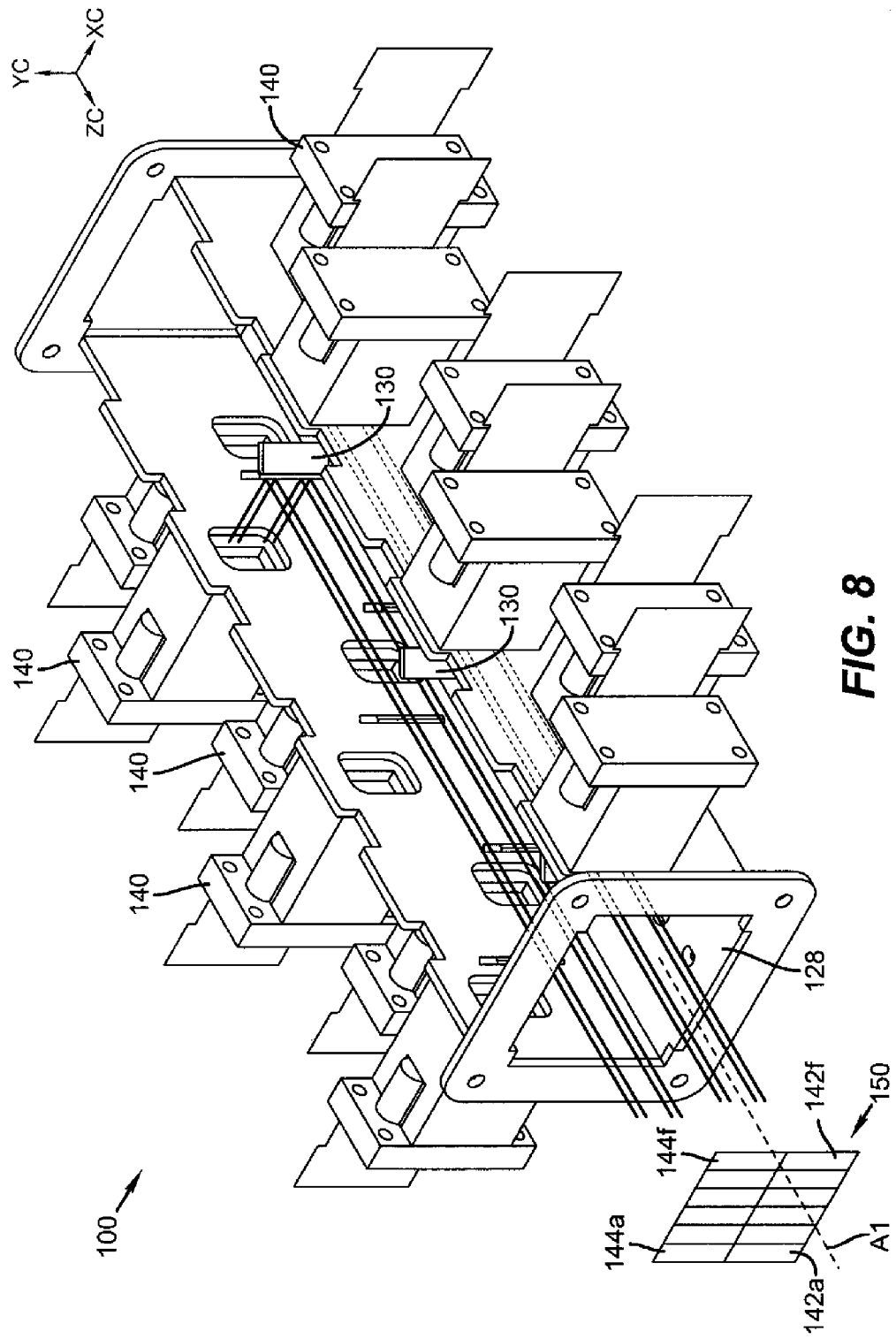
FIG. 8 a perspective of a beam alignment chamber with top cover removed and showing laser array sources on both sides.

The perspective of FIG. 8 shows beam alignment chamber 100 populated with twelve array sources 140, six along each side wall 120 and 122. The twelve array sources 140 are paired with twelve reflectors 130, mounted on both base 110 and cover 126. The aligned output beams from each of array sources 140 then provide an output light beam array 150 that, considered in cross-section, forms an aligned two-dimensional array of light beams where the contribution of each array source 140 is centered over a particular portion of the beam. In embodiments of the present invention, the output light emitted as output light beam array 150 from output opening 128 has a pattern that is advantageous for providing an illumination beam, with dimensions adapted for the aspect ratio of the spatial light modulator that is used (for example, spatial light modulator 60 in FIGS. 3A, 3B).

Figure 9:
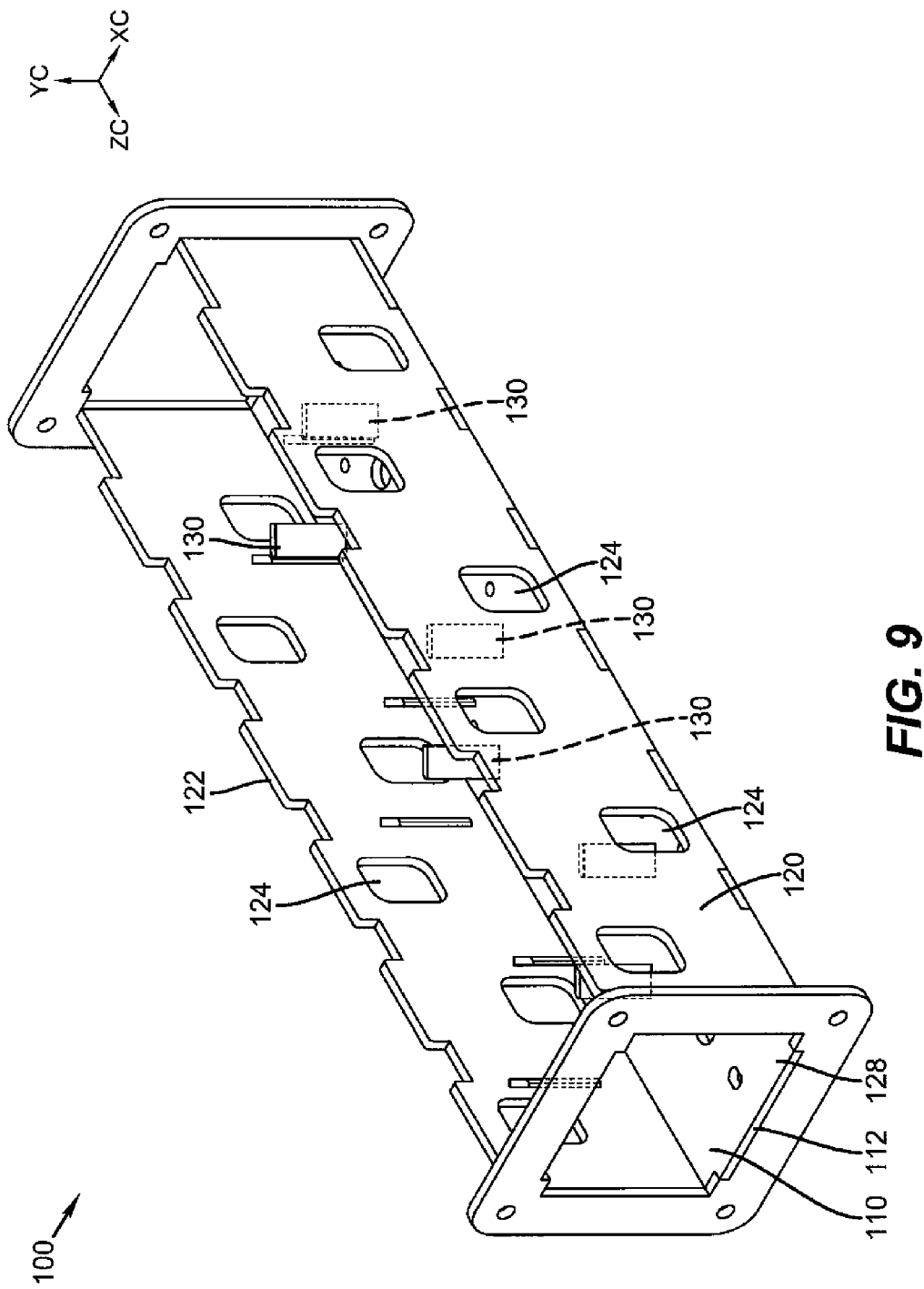
FIG. 9 is a perspective of a beam alignment chamber showing the relative positions of reflectors mounted on the base and cover.
Figure 10:
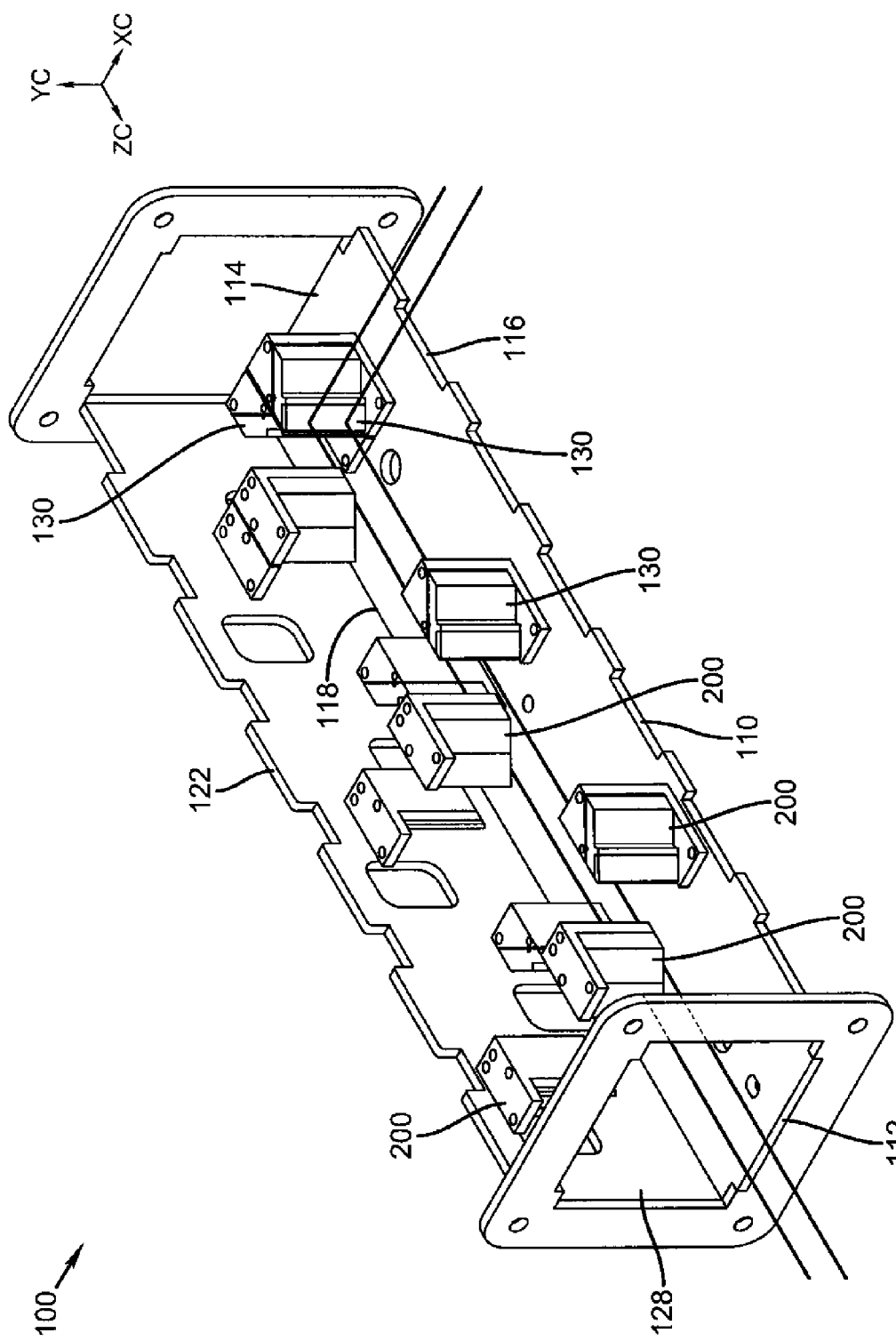
FIG. 10 is a perspective of a beam alignment chamber with one side and top cover not visible, showing one type of independently adjustable mirror mount.
Figure 11:
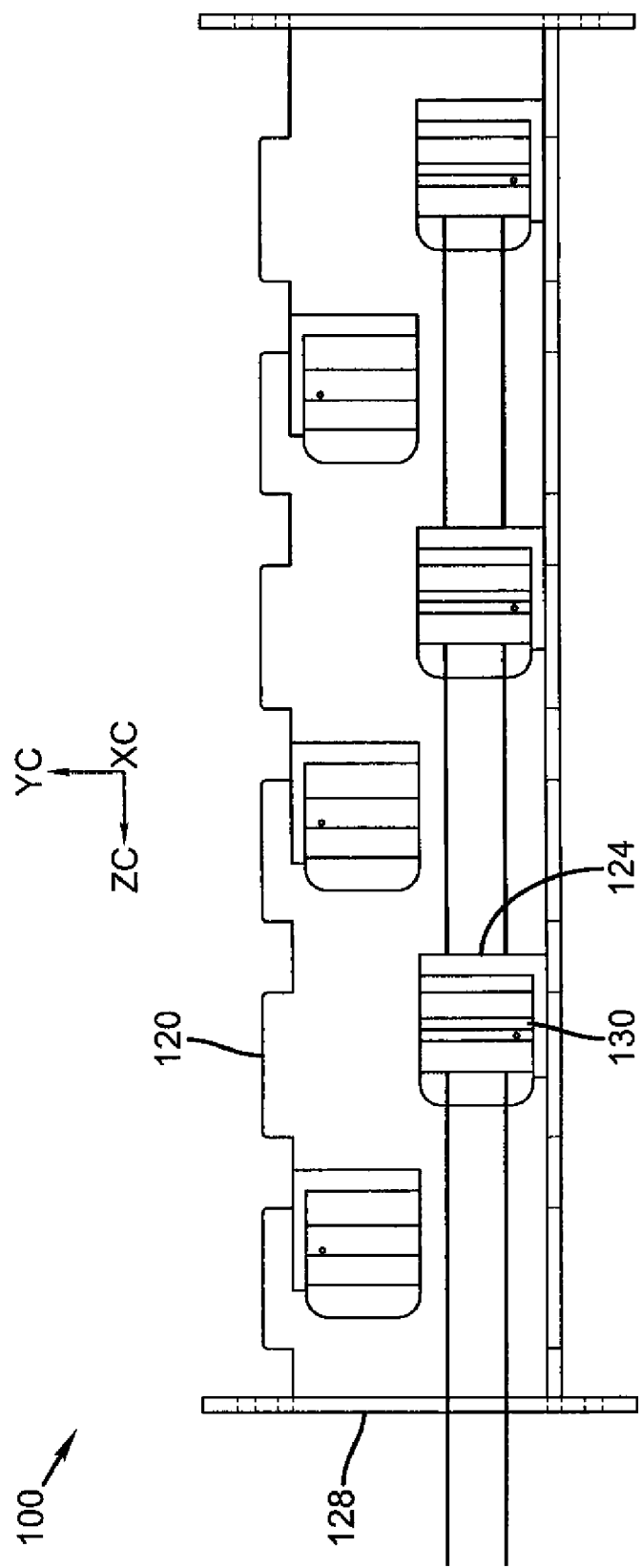
FIG. 11 is a plan view showing a side wall of the beam alignment chamber.

The perspective of FIG. 9 shows the positions of cover-mounted and base-mounted reflectors 130 for the populated beam alignment chamber 100 of FIG. 8. The perspective view of FIG. 10 shows an embodiment using mirror mounts 200, described in more detail subsequently.

Figure 12:
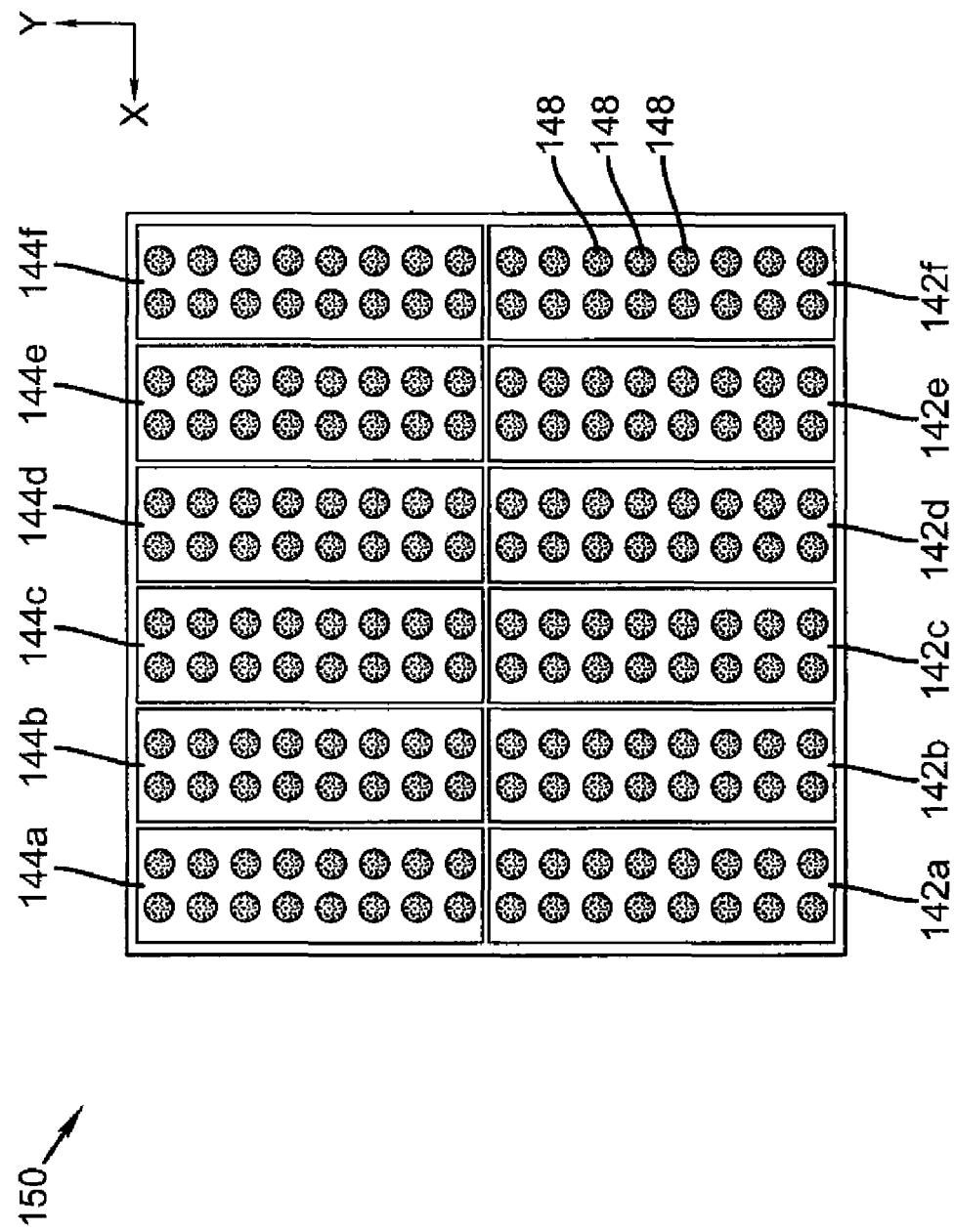
FIG. 12 is a plan view showing the portions of the output beam from multiple aligned laser arrays.

The plan view of FIG. 12 shows how the aligned light beams from each solid-state light array source 140 in beam alignment chamber of FIG. 8 form an output light beam array 150 as an aligned two-dimensional array of parallel light beams that has a rectangular aspect ratio. For the embodiment of beam alignment chamber 100 shown in FIGS. 7-11, the array light sources 140 that are paired with base-mounted reflectors 130 form the lower portion of output light beam array 150, with its six composite parts, aligned array beams 142a, 142b, 142c, 142d, 142e and 142f. Similarly, array light sources 140 that are paired with cover-mounted reflectors 130 form the upper portion of output light beam array 150, with aligned array beams 144a, 144b, 144c, 144d, 144e and 144f. This same relationship for shaping the output illumination is shown in FIGS. 7 and 8. (The output shown as output light beam array 150 in FIG. 7 represents only that portion of the output that is provided from based-mounted reflectors 130. Note that only three of the six array sources 140 are shown in position in FIG. 7.) Each of the aligned array beams 142a-142e and 144a-142e comprise an array of individual light beams 148 from a corresponding array light source 140.

Figure 13:
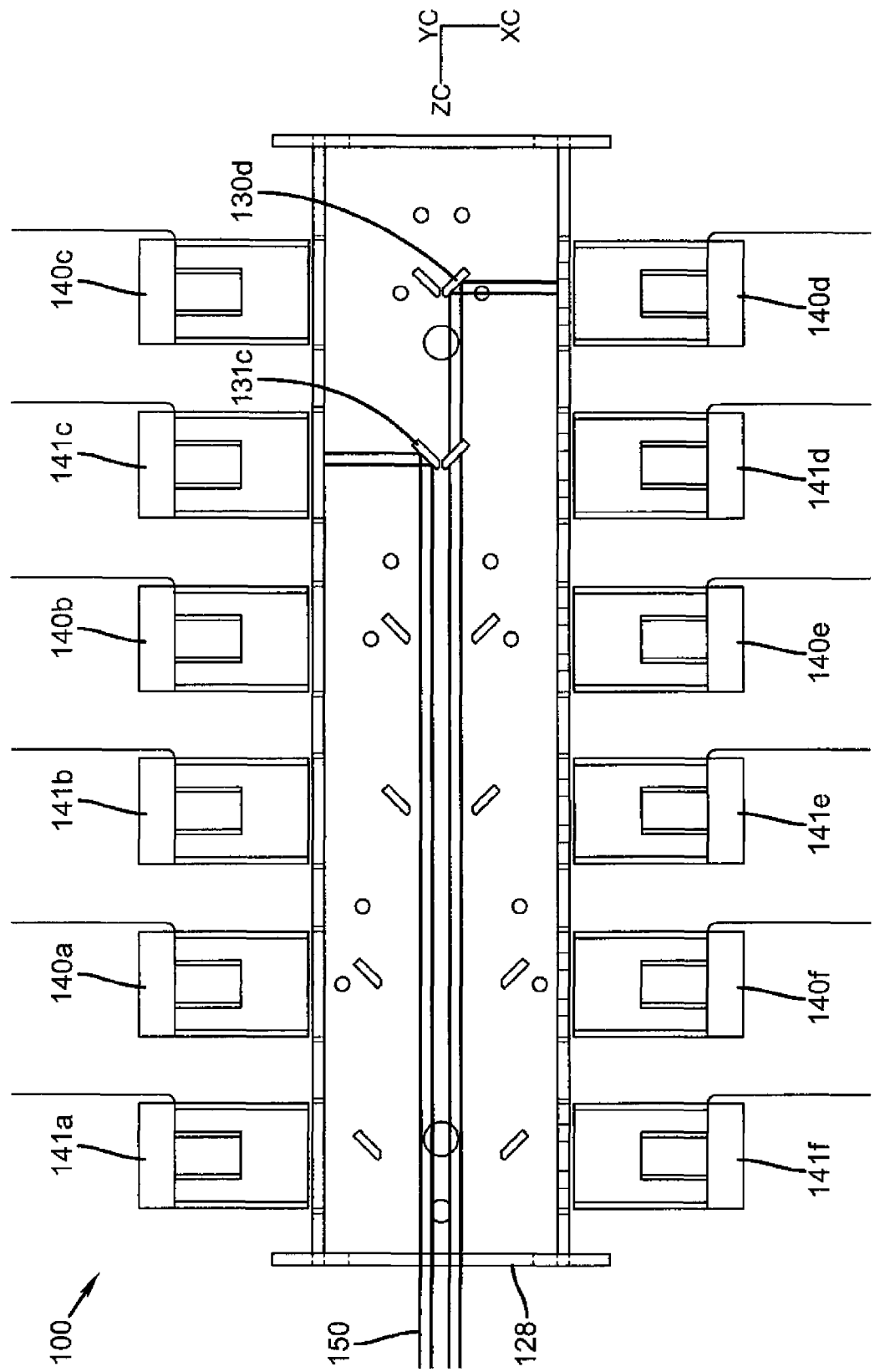
FIG. 13 is a top view showing representative light paths for one of the top-mounted and one of the base-mounted reflectors.

FIG. 13 is a top view of beam alignment chamber 100 showing the pairing of each array source 140 with its corresponding reflector 130 for forming output light beam array 150 in one embodiment. Array light sources 141a, 141b, 141c, 141d, 141e and 141f mount on cover 126 and form corresponding aligned array beams 144a, 144b, 144c, 144d, 144e, and 144f, respectively, of FIG. 12. Similarly, array light sources 140a, 140b, 140c, 140d, 140e and 140f mount on base 110 and form corresponding aligned array beams 142a, 142b, 142c, 142d, 142e, and 142f, respectively, of FIG. 12. The beam paths for top mounted array source 141c and base-mounted array source 140d are traced in FIG. 13. Array source 140d is paired with a base-mounted reflector 130d. Similarly, array source 141c is paired with a cover-mounted reflector 131c.

Although laser light sources in array light sources 140 may be collimated, there are some laser types that have significant beam divergence. Typically, beam divergence at the laser source is at different angles in orthogonal directions. Beam divergence is often corrected in at least one orthogonal direction using a cylindrical lens element or an array of lenslets or other optical elements mounted at or near the output of the laser emitter itself. While both beam divergence directions may be corrected with a bi-cylindrical lens, two lenses in series having respectively orthogonal curvatures, these lenses are expensive and are difficult to align properly. Therefore, with respect to the line of laser emitters 148 in FIG. 12, beam divergence at the laser array may be uncorrected with respect to both axes, but is typically corrected only in the direction of the x-axis. Beam divergence in the orthogonal direction, along the y axis shown in FIG. 12, also needs correction.

The conventional solution for correcting y-axis beam divergence is to provide a collimating cylindrical lens at the output of each array. This solution, however, is costly, adding twelve additional lenses to the component count for beam alignment chamber 100 shown in FIGS. 7-11, for example. Optionally, reflectors 130 can be cylindrical in shape, rather than planar, formed to correct for beam divergence. However, each of these cylindrical mirrors would be substantially more expensive than the common planar mirror depicted in FIGS. 8-11. Moreover, adjustment for pitch and yaw would be further complicated by surface curvature.

Figure 14:
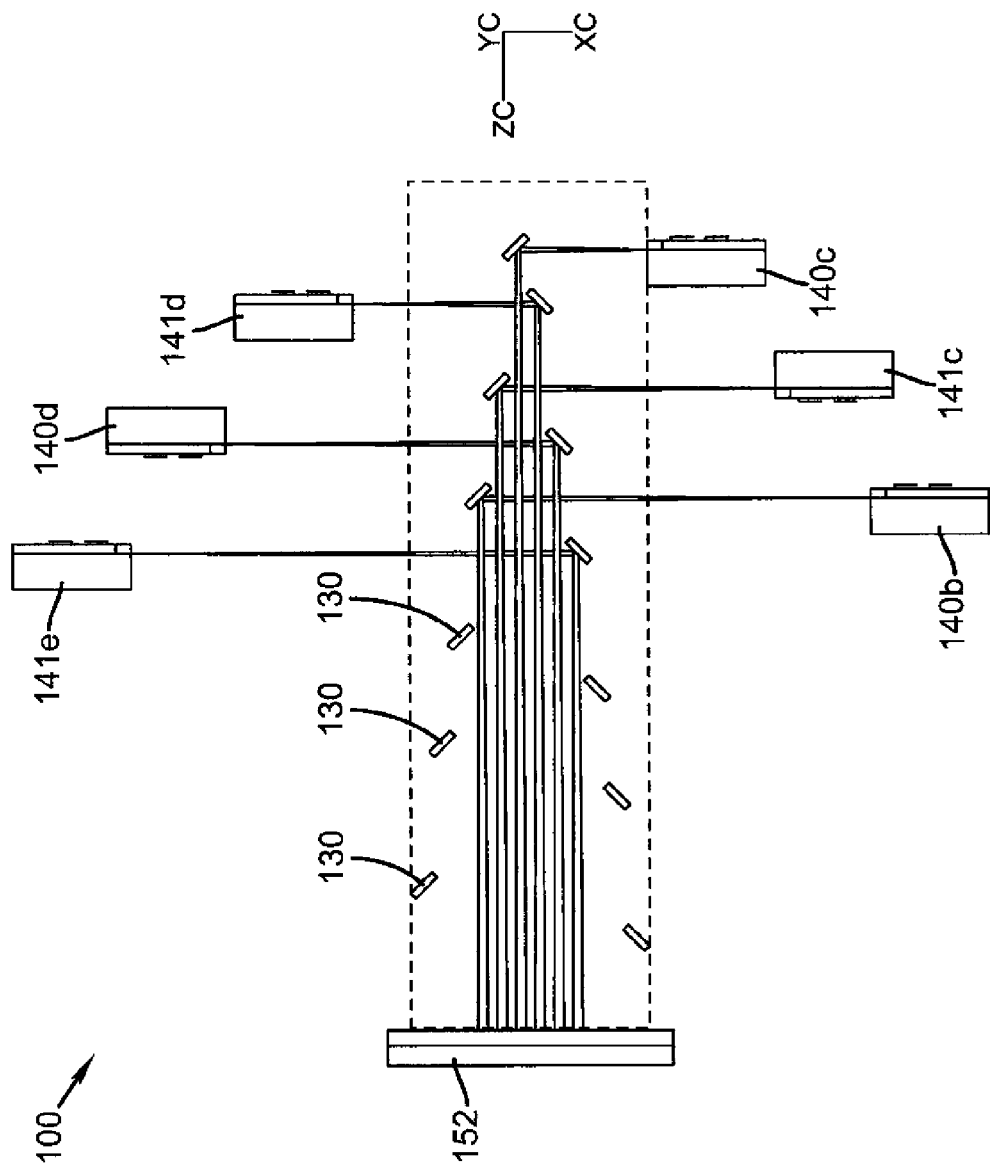
FIG. 14 is a top view showing equalized optical path lengths for a portion of the beam alignment chamber.
Figure 15:
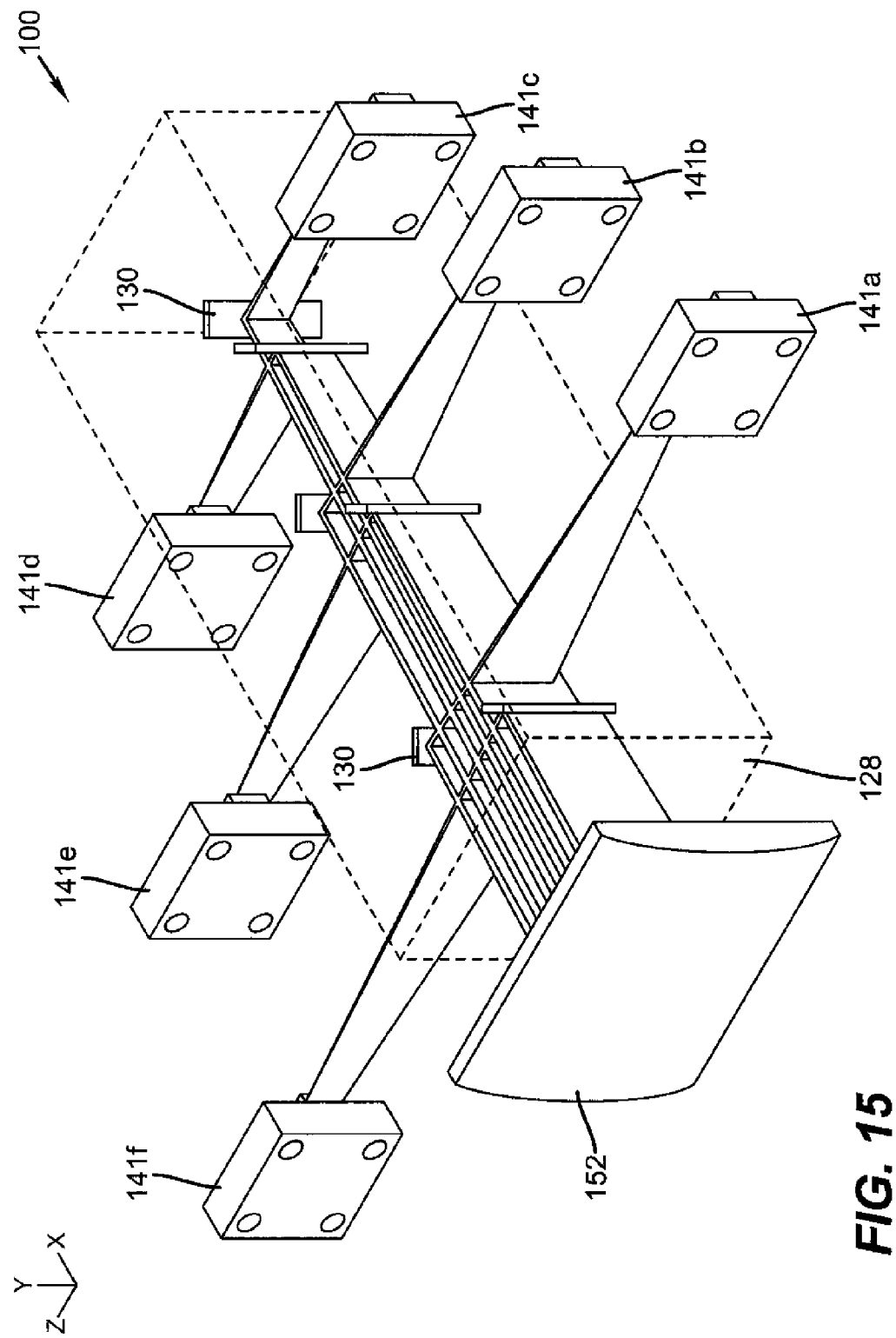
FIG. 15 is a perspective that shows how equalized optical path lengths can be used to simplify optics for conditioning the output beam.

In contrast to the cost and complexity of conventional approaches to this problem, embodiments of the present invention provide correction for beam divergence by making the optical path distance for each laser source equal, thus allowing the use of only a single cylindrical lens in the output light beam array since the divergence characteristics of each light beam will be consistent. Referring to FIGS. 14 and 15, there are shown top and perspective views, respectively, of beam alignment chamber 100 with equal optical path distances and a single corrective cylindrical lens 152. In the embodiment shown in FIGS. 14 and 15, beam paths are interleaved, passing through each other using an arrayed arrangement of staggered reflectors that differs from that shown in FIG. 13, for example. FIG. 14 shows equalized optical path distances for a portion of the array sources. FIG. 15 shows beam divergence in the direction of the linear array of emitters for each of a set of array light sources 141a, 141b, 141c, 141d, 141e and 141f. When these light emitters have equal optical path distances, the angle of the light that is incident on cylindrical lens 152 from each source is substantially the same. Cylindrical lens 152 can then provide collimation along the divergence axis. In this manner, separate collimating optics are not required for each individual array light source.

Cylindrical lens 152 is only a representative configuration. In general, there can be more than one optical element in the path of the aligned light beams and providing collimation to the output light. For example, crossed cylindrical lenses can be used to correct the divergence in each of the two orthogonal axes. In an alternate embodiment, a separate collimating lens (not shown) is provided in the path of each array source 140, so that the light that is output from output opening 128 is collimated without the need for cylindrical lens 152 or other collimation optics as shown in FIG. 15.

Figure 16:
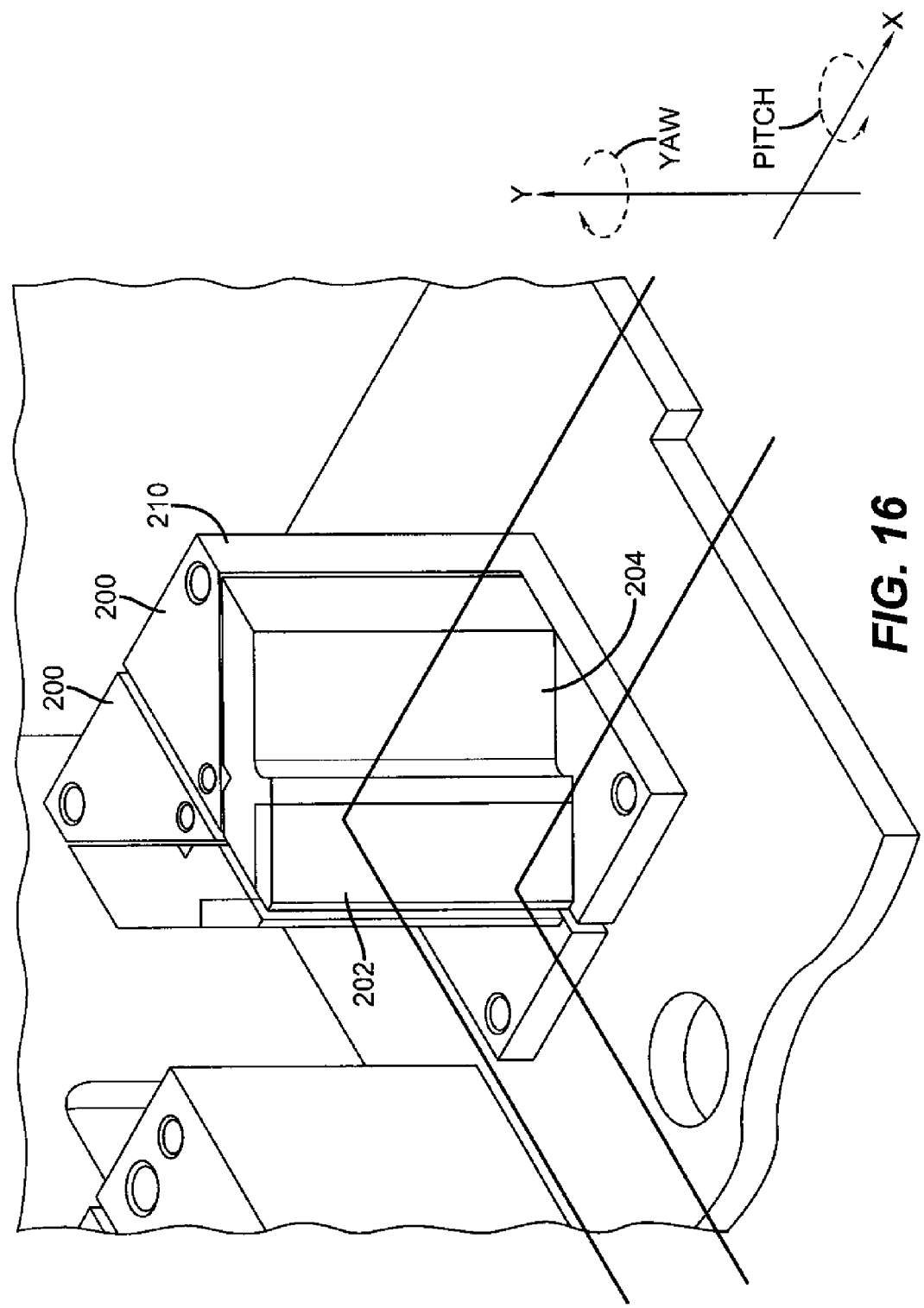
FIG. 16 is a perspective of kinematic mirror mounts with independently adjustable pitch and yaw in one embodiment.

Beam alignment chamber 100 uses multiple reflectors 130, each of which can be separately adjusted for pitch and yaw. Referring to FIG. 16, a base-mounted mirror mount 200 having this adjustment capability is shown. A reflective element 202 has a supporting frame 204 with adjustable coupling to a base member 210. Pitch adjustment is about the x-axis using the axes assignments shown in FIG. 16. Yaw adjustment is about the y-axis. It can be appreciated that a number of different mirror mount embodiments are possible for use within beam alignment chamber 100.

Beam alignment chamber 100 of the present invention can be used as the illumination system component of a projector apparatus, such as an apparatus having the basic architecture described earlier with reference to projector apparatus 10 in FIGS. 3A and 3B. The light output from beam alignment chamber 100 can be further conditioned, such as being uniformized using an integrator bar or other device, to provide a more uniform beam of illumination for modulation. Reflectors 130 can be mounted along a single plane, such as in the base-mounted embodiment shown in FIG. 7, or in two planes, as in the cover-mounted and base-mounted embodiment shown in FIG. 8. For high efficiency, reflectors 130 can be dichroic surfaces.

Using the beam alignment chamber of the present invention allows a compact packaging arrangement for grouping together the output light from multiple laser arrays, without introducing angular content and thereby effectively increasing the etendue of the illumination system for a projection apparatus. The beam alignment chamber is highly modular, allowing individual laser arrays to be replaced without the need for complete realignment of multiple components in the optical path. Adjustments for beam alignment are made at the reflector, rather than by repositioning or otherwise adjusting the laser apparatus itself.

Array light sources 140 can be packaged in modular fashion and fitted directly against openings 124 in side walls 120 and 122, for example, in FIG. 7. This arrangement can help to reduce stray light and may be of particular value where shielding from laser light is important to the design of an illumination system.

Figure 17:
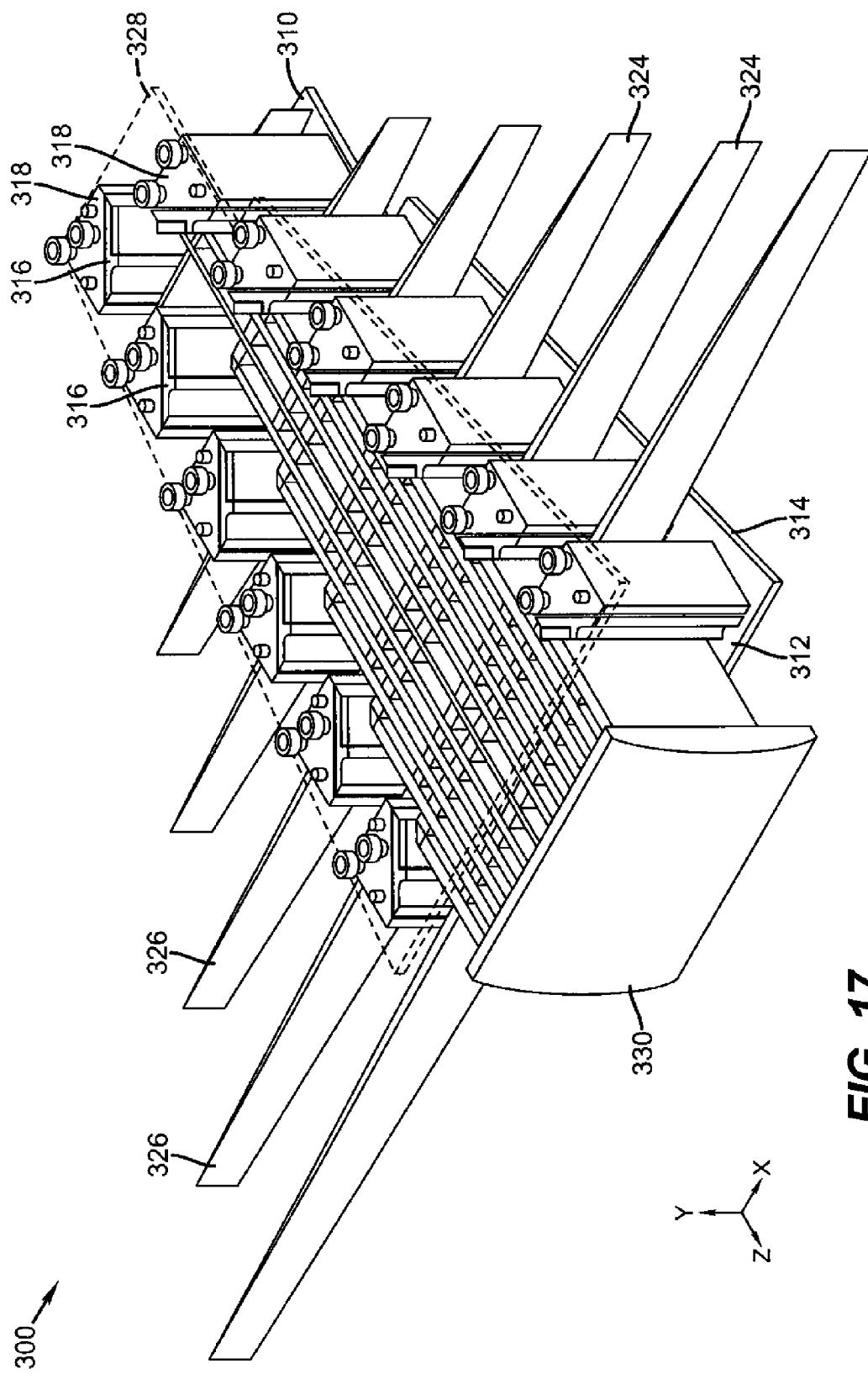
FIG. 17 is a perspective of an alternate embodiment of a beam alignment chamber having no side walls.

An alternate embodiment of the present invention is shown in FIG. 17 wherein beam alignment chamber 300 is open and does not include any walls. Beam alignment chamber 300 has a base 310 extending in a length direction corresponding to the z-axis. Base 310 has a front edge 312 a first side edge 314 and a second side edge which is hidden in FIG. 17, but which is located on the opposite side of base 310 from the first side edge 314. A plurality of reflectors 316 are mounted on the base 310 using kinematic mirror mounts 318. The mirror mounts 318 provide independent yaw and pitch adjustments for the reflectors 316. A plurality of arrays of light sources (not shown in FIG. 17) are provided, each of the arrays of light sources being paired with one of the reflectors 316. Each array of light sources is disposed to direct an array of light beams onto its corresponding reflector 316. FIG. 17 shows a plurality of arrays of light beams 324 entering the beam alignment chamber on a first side, and a plurality of arrays of light beams 326 entering the beam alignment chamber on a second side. The reflectors 316 are disposed to direct the light beams from the corresponding arrays of light sources along the length of the beam alignment chamber forming an aligned two-dimensional array of parallel light beams. The yaw and pitch adjustments on the mirror mounts 318 are used to align the beams to ensure that they are parallel.

An optional cylinder lens 330 positioned in the optical path of the aligned two-dimensional array of light beams is disposed to correct for beam divergence in the aligned two-dimensional array of light beams. The output of the cylinder lens 330 is a corrected aligned two-dimensional array of light beams that is collimated. In this case, it is preferable to position the arrays of light sources so that the optical distance between each light source and the cylinder lens is substantially equal for each of the light beams so that the beam geometries are consistent. As discussed earlier, other forms of optical elements can optionally be used to correct the divergence of the light beams as well. For example, if the light beams diverge in two different axes, a crossed pair of cylinder lens can be used to independently correct the divergence with respect to each axis.

Also shown in FIG. 17 is an optional cover 328. The cover 328 can provide additional support for the mirror mounts 318 giving additional structural stability. Alternately, the cover 328 can be spaced farther apart from base 310 using spacers (not shown). In this case, a second set of reflectors can be mounted to the cover 328, similar to the arrangement described earlier with reference to FIGS. 7-11. Each cover-mounted reflector would be paired with a corresponding array of light sources and would be disposed to direct the light beams from the light sources along the length of the beam alignment chamber, forming the aligned two-dimensional array of parallel light beams in cooperation with the light beams associated with the base-mounted reflectors.

The invention has been described in detail with particular reference to certain preferred embodiments thereof, but it will be understood that variations and modifications can be effected within the spirit and scope of the invention. For example, where laser arrays are described in the detailed embodiments, other solid-state emissive components could be used as an alternative. Supporting lenses and other optical components may also be added to each optical path. Various types of sensors can be deployed at one or more positions within the projector in order to sense the light intensity in each color channel. Thus, what is provided is an apparatus and method for aligning solid state illumination sources.

PARTS LIST

10. Projector apparatus
12. Light source
14. Prism assembly
18. Optics
20, 20r, 20g, 20b. Spatial light modulators
26. Laser
28. Incidence facet
30. Projection lens
32. Incident face
34. Output face
36. Redirection surface
38. Light-redirecting facet
40r, 40g, 40b. Light modulation channels
42. Illumination system
44, 44', 44a, 44b. Light source arrays
46. Mirror
48. Light redirecting prism
50. Lens
51. Integrator
52. Light guide
54. Lens
60. Spatial light modulator
70. Projection optics
76. Color combiner
80. Display surface
84. Dichroic surface
100. Beam alignment chamber
110. Base
112. Front edge
114. Back edge
116. First side edge
118. Second side edge
120. First side wall
122. Second side wall
124. Side opening
126. Cover
128. Output opening
130. Reflector
130d. Base-mounted reflector
131c. Cover-mounted reflector
132. Front wall
140, 140a, 140b, 140c, 140d, 140e, 140f. Array light sources
141a, 141b, 141c, 141d, 141e, 141f. Array light sources
150. Output light beam array
142a, 142b, 142c, 142d, 142e, 142f. Aligned array beams
144a, 144b, 144c, 144d, 144e, 144f. Aligned array beams
148. Light beam
150. Output light beam array
152. Cylindrical lens
154. Adjustment access hole
200. Mirror mount
202. Reflective element
204. Frame
210. Base member
300. Beam alignment chamber
310. Base
312. Front edge
314. First side edge
316. Reflector
318. Mirror mount
324. Array of light beams
326. Array of light beams
328. Cover
330. Cylindrical lens
A, A1. Axis
D1, D1'. Emission direction
D2. Output direction
x, y, z. Axis

What is claimed is:

1. A beam alignment system for generating an aligned two-dimensional array of parallel light beams, comprising:
   a) a beam alignment chamber including:
      i) a base, the base extending in a length direction having a front edge, a first side edge and a second side edge; and
      ii) a plurality of reflectors mounted on the base, each having independent yaw and pitch adjustments; and
   b) a plurality of arrays of light sources, each array of light sources generating an array of light beams and being paired with a corresponding reflector and being disposed to direct the light beams onto its corresponding reflector, and wherein the reflectors are disposed to direct the light beams along the length of the beam alignment chamber forming an aligned two-dimensional array of parallel light beams.

2. The beam alignment system of claim 1 wherein the arrays of light sources are mounted external to the beam alignment chamber and are disposed to direct light into the beam alignment chamber and onto the corresponding base-mounted reflectors.

3. The beam alignment system of claim 2 wherein some of the arrays of light sources are positioned on a first side of the beam alignment chamber and the remaining arrays of light sources are positioned on a second side of the beam alignment chamber opposed to the first side of the beam alignment chamber.

4. The beam alignment system of claim 1 wherein the beam alignment chamber further includes a cover spaced apart from the base, together with a plurality of reflectors mounted to the cover, each cover-mounted reflector having independent yaw and pitch adjustments, and wherein each cover-mounted reflector is paired with a corresponding array of light sources generating an array of light beams and is disposed to direct the light beams along the length of the beam alignment chamber, forming the aligned two-dimensional array of parallel light beams in cooperation with the light beams associated with the base-mounted reflectors.

5. The beam alignment system of claim 4 wherein adjustment holes are provided in the cover to access the independent yaw and pitch adjustments for both the cover-mounted reflectors and the base-mounted reflectors.

6. The beam alignment system of claim 1 wherein each light beam entering the beam alignment chamber is uncorrected for divergence with respect to at least one axis, and further including one or more optical elements positioned in the optical path of the aligned two-dimensional array of light beams disposed to correct the beam divergence with respect to at least one axis, and wherein the light sources are positioned so that the optical distance between each light source and the one or more optical elements is substantially equal for each of the light beams.

7. The beam alignment system of claim 6 wherein the corrected aligned two-dimensional array of light beams is collimated.

8. The beam alignment system of claim 6 wherein the one or more optical elements comprise a cylinder lens providing correction for the beam divergence with respect to one axis.

9. The beam alignment system of claim 6 wherein the one or more optical elements comprise a pair of crossed cylinder lenses providing correction for the beam divergence with respect to two axes.

10. The beam alignment system of claim 1 wherein each light beam entering the beam combining chamber is uncorrected for divergence with respect to at least one axis, and wherein the reflectors are cylindrical reflectors that correct the beam divergence with respect to one axis.

11. The beam alignment system of claim 1 wherein the light sources are laser light sources.

12. The beam alignment system of claim 1 wherein the beam alignment chamber is open, having no side walls connected to the first side edge of the base or the second side edge of the base.

13. The beam alignment system of claim 1 wherein the beam alignment chamber is open, having no side walls connected to any edges of the base.

14. The beam alignment system of claim 1 wherein the beam alignment system is a component of a laser source system that provides a two-dimensional array of parallel laser beams for use in a laser projection system, and wherein the laser projection system further comprises:
- an illumination system configured to uniformize laser light it receives;
- an image forming system configured to interact with laser light that has been both uniformized by the illumination system; and
- a projection system configured to project the laser light image onto a viewing screen.

* * * * *